US012751065B2

(12) United States Patent
Chen et al.

(10) Patent No.: US 12,751,065 B2
(45) Date of Patent: Sep. 29, 2026

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Shih-Cheng Chen, New Taipei City (TW); Wen-Ting Lan, Hsinchu City (TW); Jung-Hung Chang, Changhua County (TW); Tsung-Han Chuang, Tainan City (TW); Chia-Cheng Tsai, Hsinchu (TW); Kuo-Cheng Chiang, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 364 days.

(21) Appl. No.: 18/395,940

(22) Filed: Dec. 26, 2023

(65) Prior Publication Data

US 2025/0212479 A1 Jun. 26, 2025

(51) Int. Cl.

| | |
|---|---|
| ***H10D 64/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(52) U.S. Cl.

CPC ......... *H10D 64/018* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 64/021* (2025.01)

(58) Field of Classification Search

CPC .... H10D 64/018; H10D 30/014; H10D 30/43; H10D 30/6735; H10D 30/6757; H10D 62/121; H10D 64/017; H10D 64/021; H10D 62/822; H10D 62/151

See application file for complete search history.

(56) References Cited

U.S. PATENT DOCUMENTS

| | | | |
|---|---|---|---|
| 9,209,247 | B2 | 12/2015 | Colinge |
| 9,236,267 | B2 | 1/2016 | De |
| 9,412,817 | B2 | 8/2016 | Yang |
| 9,412,828 | B2 | 8/2016 | Ching |
| 9,472,618 | B2 | 10/2016 | Oxland |

(Continued)

OTHER PUBLICATIONS

TW Office Action dated May 22, 2025 in Taiwan application No. 113109853.

*Primary Examiner* — S M Sohel Imtiaz

(74) *Attorney, Agent, or Firm* — McClure, Qualey & Rodack, LLP

(57) ABSTRACT

Semiconductor structures and methods for manufacturing the same are provided. The semiconductor structure includes nanostructures formed over a substrate along a first direction, and a gate structure formed over the nanostructures along a second direction. The semiconductor structure includes an S/D structure formed adjacent to the gate structure, and a plurality of inner spacer layers between the gate structure and the S/D structure. The semiconductor structure includes a hard mask layer formed on the inner spacer layers, and a top surface of the hard mask layer is higher than a top surface of the S/D structure.

20 Claims, 20 Drawing Sheets

(56) References Cited

U.S. PATENT DOCUMENTS

| | | | | |
|---|---|---|---|---|
| 9,502,265 | B1 | 11/2016 | Jiang | |
| 9,520,482 | B1 | 12/2016 | Chang | |
| 9,536,738 | B2 | 1/2017 | Huang | |
| 9,576,814 | B2 | 2/2017 | Wu | |
| 9,608,116 | B2 | 3/2017 | Ching | |
| 2021/0083090 | A1* | 3/2021 | Wang | H10D 30/62 |
| 2021/0134952 | A1* | 5/2021 | Fung | H10D 62/121 |
| 2021/0226020 | A1* | 7/2021 | Lin | H10D 30/6757 |
| 2022/0115374 | A1 | 4/2022 | Chiang et al. | |
| 2022/0238683 | A1* | 7/2022 | Wu | H10D 30/014 |
| 2022/0238693 | A1* | 7/2022 | Chuang | H10D 84/0147 |
| 2022/0320116 | A1* | 10/2022 | Lin | H10B 10/125 |
| 2022/0344217 | A1* | 10/2022 | Ko | H10D 84/017 |
| 2022/0399461 | A1* | 12/2022 | Huang | H10D 30/6211 |
| 2023/0369453 | A1* | 11/2023 | Zhang | H10D 62/121 |
| 2023/0377998 | A1* | 11/2023 | Smith | H10D 84/038 |

* cited by examiner

SEMICONDUCTOR STRUCTURE AND METHOD FOR FORMING THE SAME

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). However, integration of fabrication of the multi-gate devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
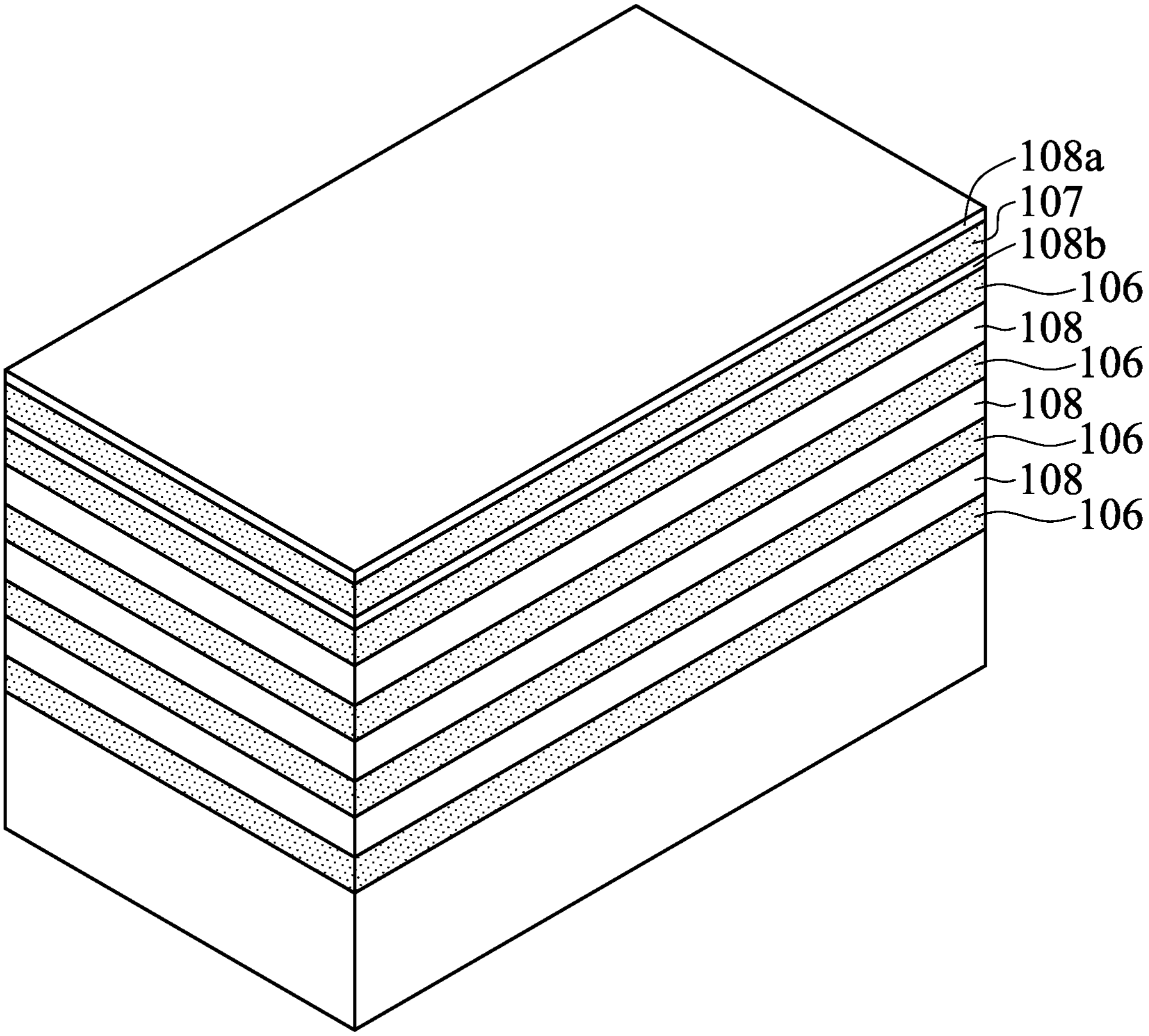
FIGS. 1A to 1E illustrate perspective views of intermediate stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

The gate all around (GAA) transistor structures described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The fins described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of semiconductor structures and methods for forming the same are provided. The semiconductor structure includes nanostructures and the gate structure formed over the nanostructures. The first gate spacer layer and the second gate spacer layer are formed on opposite sidewall surfaces of the gate structure. The S/D structures are formed adjacent to the gate structure. The second gate spacer layer is removed to provide a large widow for forming the S/D structure before forming the S/D structures. In addition, the unwanted residue during forming the S/D structures can easily be removed by forming the large window. As a result, the formation process and the quality of the S/D structures are improved. Therefore, the semiconductor structure is improved. The source/drain (S/D) structure or region(s) may refer to a source or a drain, individually or collectively dependent upon the context.

FIGS. 1A to 1E illustrate perspective views of intermediate stages of manufacturing a semiconductor structure 100*a*, in accordance with some embodiments. As shown in FIG. 1A, first semiconductor material layers 106, second semiconductor material layers 108 and a third semiconductor material layer 107 are formed over a substrate 102. Note that a top second semiconductor material layer 108*a* and a bottom second semiconductor material layer 108*b* are formed on opposite sidewall surfaces of the third semiconductor material layer 107. The thickness of the bottom second semiconductor material layer 108*b* is greater than the thickness of the top second semiconductor material layer 108*a*, but smaller than the thickness of the third semiconductor material layer 107. In some embodiments, the thickness of the top second semiconductor material layer 108*a* is in a range from about 1 nm to about 1.5 nm. In some embodiments, the thickness of the bottom second semiconductor material layer 108*b* is in a range from about 3 nm to about 5 nm. In some embodiments, the thickness of the third semiconductor material layer 107 is in a range from about 8 nm to about 13 nm.

The substrate 102 may be a semiconductor wafer such as a silicon wafer. Alternatively or additionally, the substrate 102 may include elementary semiconductor materials, compound semiconductor materials, and/or alloy semiconductor materials. Elementary semiconductor materials may include, but are not limited to, crystal silicon, polycrystalline silicon, amorphous silicon, germanium, and/or diamond. Compound semiconductor materials may include, but are not limited to, silicon carbide, gallium arsenic, gallium phosphide, indium phosphide, indium arsenide, and/or indium antimonide. Alloy semiconductor materials may include, but are not limited to, SiGe, GaAsP, AlInAs, AlGaAs, GaInAs, GaInP, and/or GaInAsP.

In some embodiments, the first semiconductor material layers 106 and the second semiconductor material layers 108 are alternately stacked over the substrate 102. In some embodiment, the first semiconductor material layers 106 and the second semiconductor material layers 108 are made of different semiconductor materials. In some embodiments, the first semiconductor material layers 106 are made of SiGe, and the second semiconductor material layers 108 are made of silicon. The third semiconductor material layer 107 is made of SiGe, and the germanium concentration of the third semiconductor material layer 107 is greater than the germanium concentration of the first semiconductor material layer 106. In some embodiments, the germanium concentration of the third semiconductor material layer 107 is in a range from about 35% to about 45%. In some embodiments, the germanium concentration of the first semiconductor material layers 106 is in a range from about 25% to about 30%.

It should be noted that although four first semiconductor material layers 106 and four second semiconductor material layers 108 are formed, the semiconductor structure may include more or fewer first semiconductor material layers 106 and second semiconductor material layers 108. For example, the semiconductor structure may include two to five of the first semiconductor material layers 106 and the second semiconductor material layers.

The first semiconductor material layers 106, the third semiconductor material layer 107 and the second semiconductor material layers 108 may be formed by using low-pressure chemical vapor deposition (LPCVD), epitaxial growth process, another suitable method, or a combination thereof. In some embodiments, the epitaxial growth process includes molecular beam epitaxy (MBE), metal organic chemical vapor deposition (MOCVD), or vapor phase epitaxy (VPE).

Figure 1B:
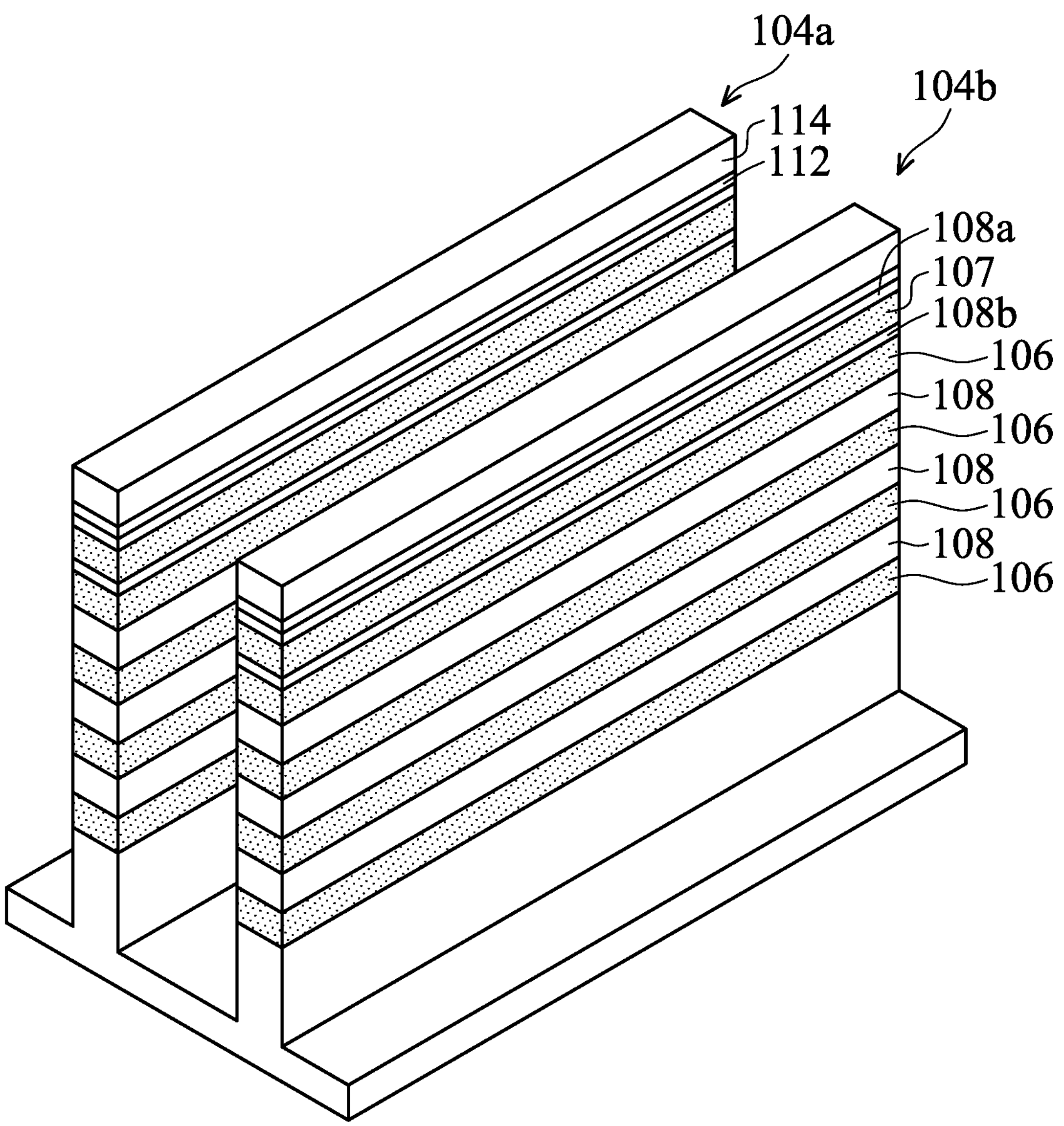

Afterwards, as shown in FIG. 1B, after the first semiconductor material layers 106, the third semiconductor material layer 107 and the second semiconductor material layers 108 are formed as a semiconductor material stack over the substrate 102, the semiconductor material stack is patterned to form a first fin structure 104*a* and a second fin structure 104*b*, in accordance with some embodiments. In some embodiments, each of the first fin structure 104*a* and a second fin structure 104*b* includes a base fin structure 105 and the semiconductor material stack of the first semiconductor material layers 106 and the second semiconductor material layers 108.

In some embodiments, the patterning process includes forming a mask structure 110 over the semiconductor material stack, and etching the semiconductor material stack and the underlying substrate 102 through the mask structure 110. In some embodiments, the mask structure 110 is a multilayer structure including a pad oxide layer 112 and a nitride layer 114 formed over the pad oxide layer 112. The pad oxide layer 112 may be made of silicon oxide, which is formed by thermal oxidation or chemical vapor deposition (CVD), and the nitride layer 114 may be made of silicon nitride, which is formed by chemical vapor deposition (CVD), such as low-pressure chemical vapor deposition (LPCVD) or plasma-enhanced CVD (PECVD).

Figure 1C:
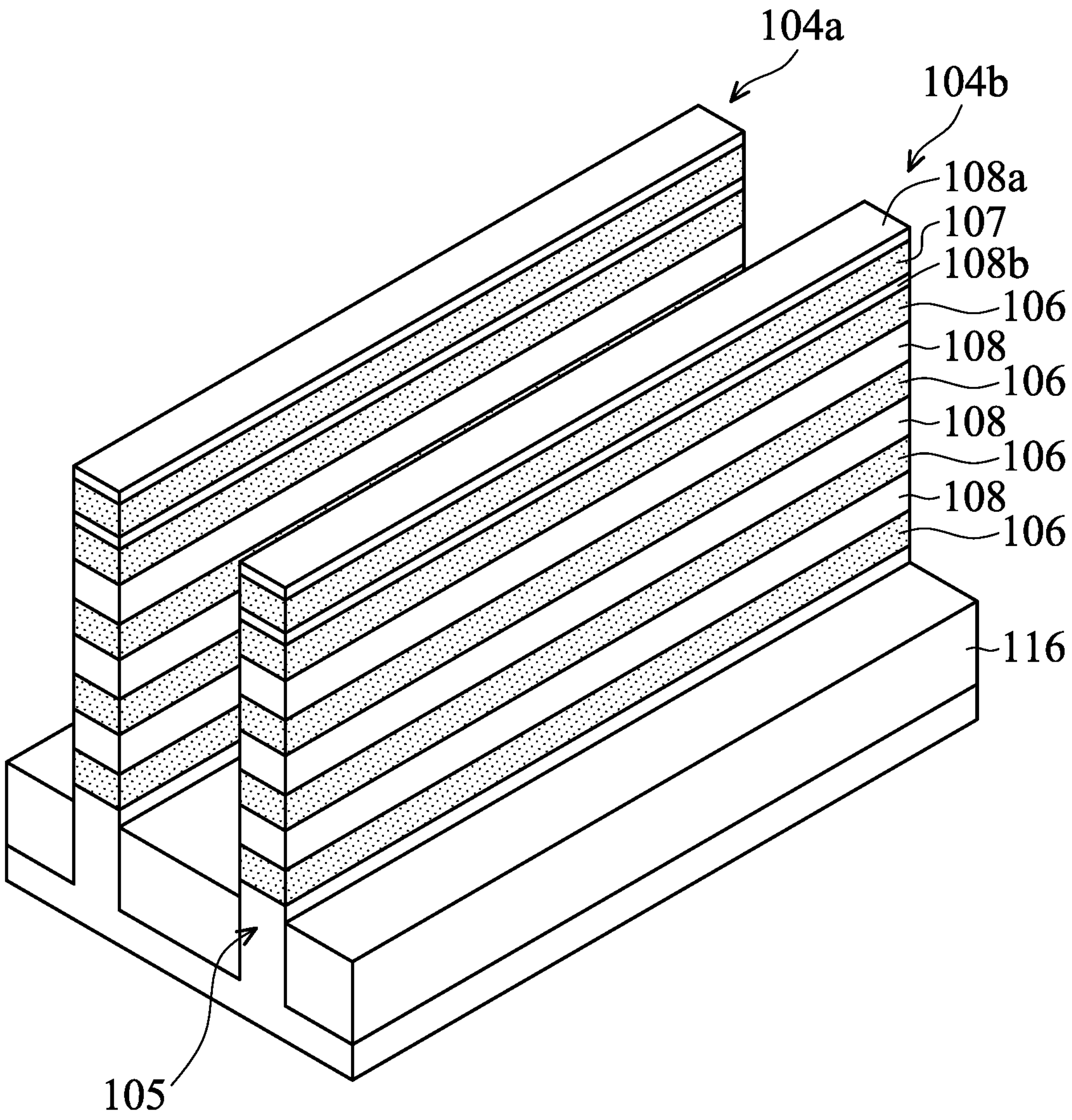

Next, as shown in FIG. 1C, after the first fin structure 104*a* and the second fin structure 104*b* is formed, an isolation structure 116 is formed around first fin structure 104*a* and the second fin structure 104*b*, and the mask structure 110 is removed, in accordance with some embodiments. The isolation structure 116 is configured to electrically isolate active regions (e.g. the first fin structure 104*a* and the second fin structure 104*b*) of the semiconductor structure 100*a* and is also referred to as shallow trench isolation (STI) feature in accordance with some embodiments.

The isolation structure 116 may be formed by depositing an insulating layer over the substrate 102 and recessing the insulating layer so that the first fin structure 104*a* and the second fin structure 104*b* is protruded from the isolation structure 116. In some embodiments, the isolation structure 116 is made of silicon oxide, silicon nitride, silicon oxynitride (SiON), another suitable insulating material, or a combination thereof. In some embodiments, a dielectric liner (not shown) is formed before the isolation structure 116 is formed, and the dielectric liner is made of silicon nitride and the isolation structure formed over the dielectric liner is made of silicon oxide.

Figure 1D:
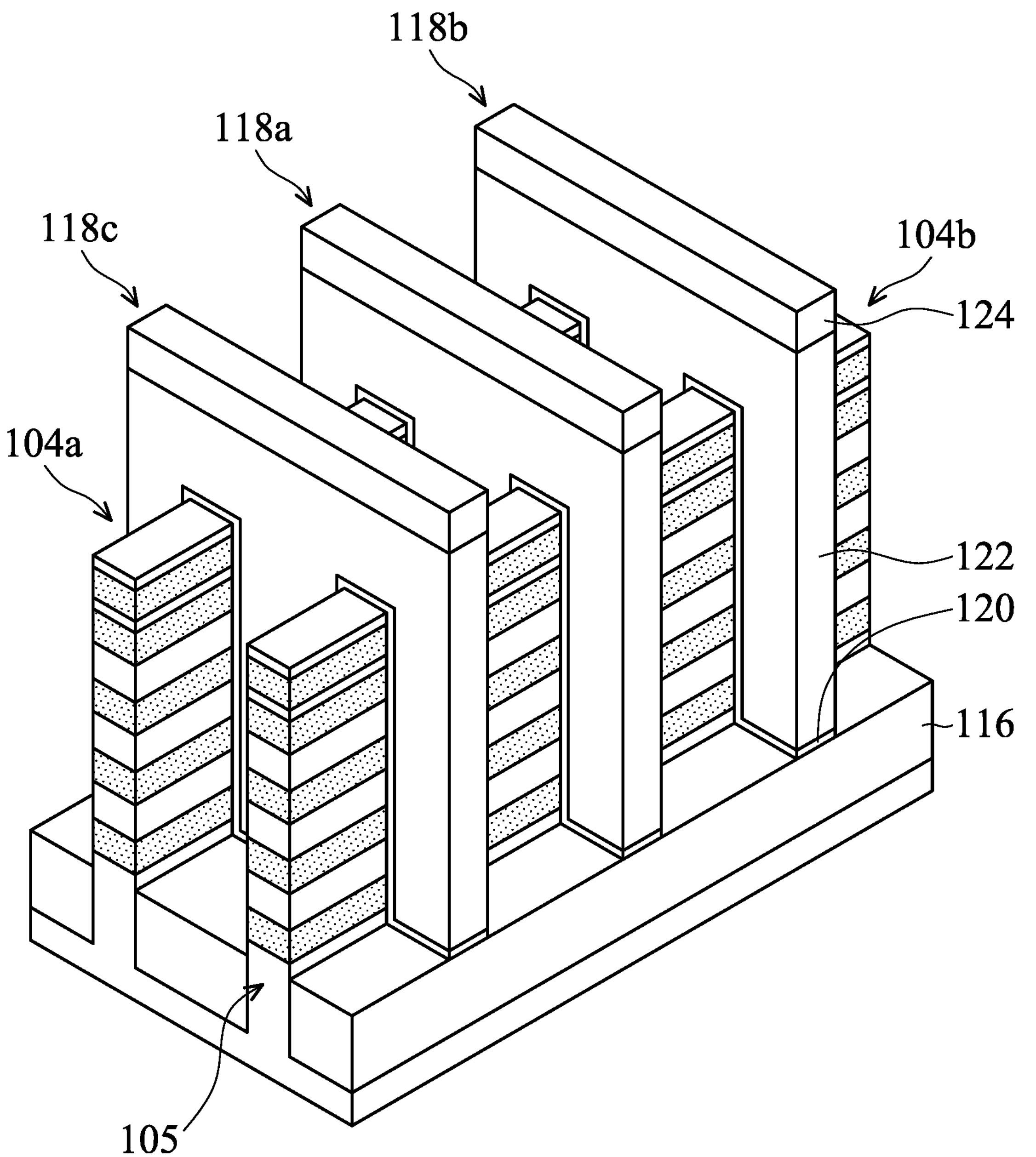

Afterwards, as shown in FIG. 1D, after the isolation structure 116 is formed, first dummy gate structure 118*a*, second dummy gate structure 118*b* and the third dummy gate structure 118*c* are formed across the first fin structure 104*a* and the second fin structure 104*b* and extend over the isolation structure 116, in accordance with some embodiments. The first dummy gate structure 118*a*, the second dummy gate structure 118*b*, and the third dummy gate structure 118*c* may be used to define the source/drain (S/D) regions and the channel regions of the resulting semiconductor structure 100*a*.

In some embodiments, each of the first dummy gate structure 118*a*, each of the second dummy gate structure 118*b*, and each of the third dummy gate structure 118*c* includes dummy gate dielectric layers 120 and dummy gate electrode layers 122. In some embodiments, the dummy gate dielectric layers 120 are made of one or more dielectric materials, such as silicon oxide, silicon nitride, silicon oxynitride (SiON), $HfO_2$, HfZrO, HfSiO, HfTiO, HfAlO, or a combination thereof. In some embodiments, the dummy gate dielectric layers 120 are formed using thermal oxidation, chemical vapor deposition (CVD), atomic vapor deposition (ALD), physical vapor deposition (PVD), another suitable method, or a combination thereof.

In some embodiments, the conductive material includes polycrystalline-silicon (poly-Si), poly-crystalline silicon-germanium (poly-SiGe), metallic nitrides, metallic silicides, metals, or a combination thereof. In some embodiments, the dummy gate electrode layers 122 are formed using chemical vapor deposition (CVD), physical vapor deposition (PVD), or a combination thereof.

In some embodiments, the hard mask layers 124 are formed over the first dummy gate structure 118*a* and the second dummy gate structure 118*b*. In some embodiments, the hard mask layers 124 include multiple layers, such as an oxide layer and a nitride layer. In some embodiments, the oxide layer is silicon oxide, and the nitride layer is silicon nitride.

The formation of the first dummy gate structure 118*a*, the second dummy gate structure 118*b* and the third dummy gate structure 118*c* may include conformally forming a dielectric material as the dummy gate dielectric layers 120. Afterwards, a conductive material may be formed over the dielectric material as the dummy gate electrode layers 122, and the hard mask layer 124 may be formed over the conductive material. Next, the dielectric material and the conductive material may be patterned through the hard mask layer 124 to form the dummy gate structure 118.

Figure 1E:
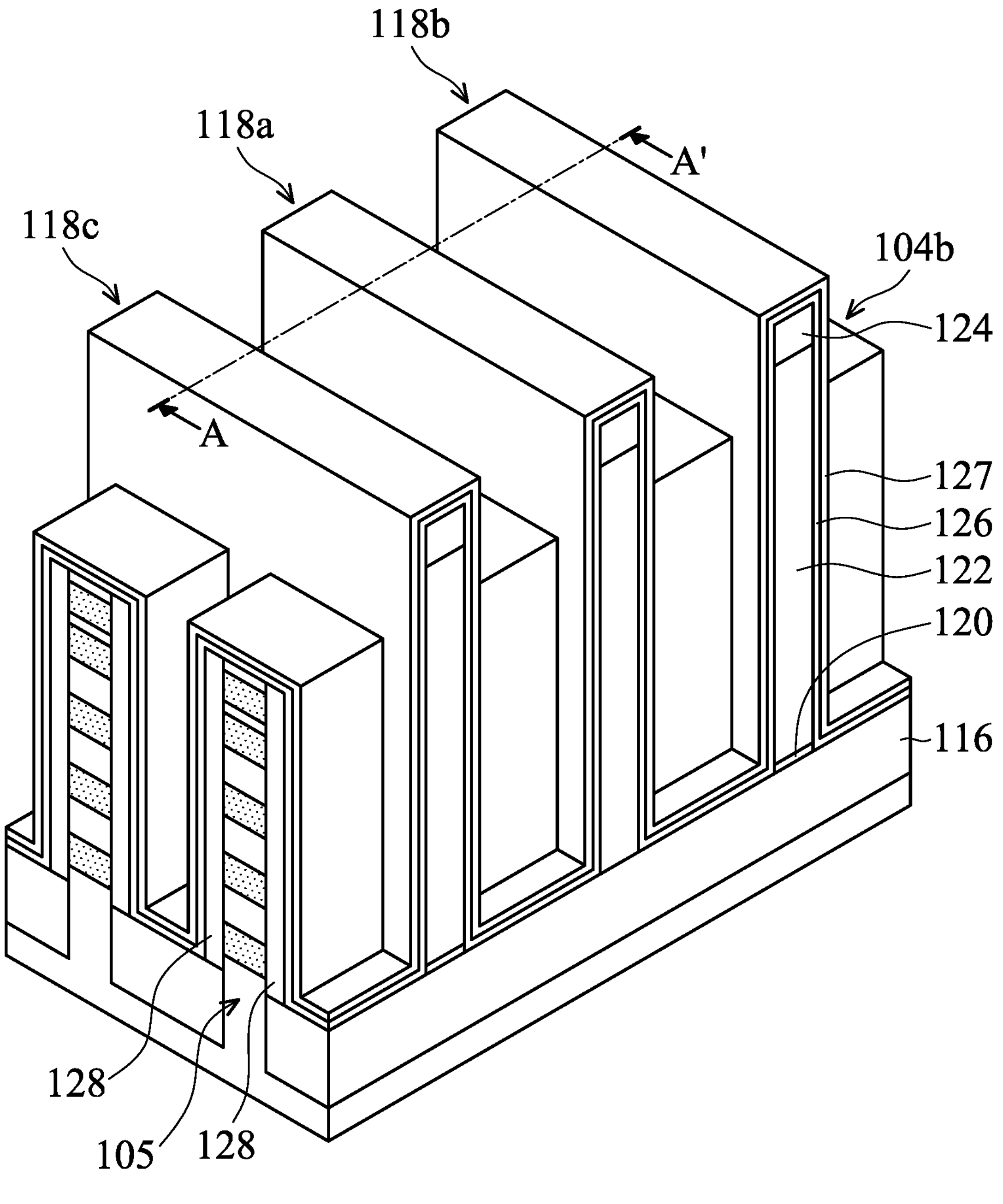

Next, as shown in FIG. 1E, after the first dummy gate structure 118*a*, the second dummy gate structure 118*b* and the third dummy gate structure 118*c* are formed, first gate spacer layers 126 and second gate spacer layers 127 are formed along and covering opposite sidewalls of the first/second/third dummy gate structures 118*a*/118*b*/118*c* and fin spacer layers 128 are formed along and covering opposite sidewalls of the source/drain regions of the first fin structure 104*a* and the second fin structure 104*b*, in accordance with some embodiments.

The first gate spacer layers 126 and second gate spacer layers 127 may be configured to separate source/drain (S/D) structures from the first/second/third dummy gate structure 118*a*/118*b*/118*c* and support the first/second/third dummy gate structure 118*a*/118*b*/118*c*, and the fin space layers 128 may be configured to constrain a lateral growth of subsequently formed source/drain structure and support the first fin structure 104*a* and the second fin structure 104*b*.

The second gate spacer layer 127 and the first gate spacer layer 126 are made of different materials. The first gate spacer layer 126 has a high etching selectivity with respect to the second gate spacer layer 127. The second gate spacer layer 127 have a greater etching rate (or etching amount) than the first gate spacer layer 126. The portion of the first gate spacer layer 126 is not removed when the entirety of the second gate spacer layer 127 is removed (shown in FIG. 2F). In some embodiments, the first gate spacer layers 126, the second gate spacer layers 127 and the fin spacer layers 128 are made of a dielectric material, such as silicon oxide (SiO2), silicon nitride (SiN), silicon carbide (SiC), silicon oxynitride (SiON), silicon carbon nitride (SiCN), silicon oxide carbonitride (SiOCN), and/or a combination thereof. The formation of the gate spacer layers 126, the second gate spacer layers 127 and the fin spacer layers 128 may include conformally depositing a dielectric material covering the first dummy gate structure 118*a*, the second dummy gate structure 118*b*, the third dummy gate structure 118*c*, the first fin structure 104*a*, the second fin structure 104*b* and the isolation structure 116 over the substrate 102, and performing an anisotropic etching process, such as dry plasma etching, to remove the dielectric layer covering the top surfaces of the first dummy gate structure 118*a*, the second dummy gate structure 118*b*, the third dummy gate structure 118*c*, the first fin structure 104*a*, the second fin structure 104*b*, and portions of the isolation structure 116.

FIGS. 2A to 2M illustrate cross-sectional representations of various stages of manufacturing the semiconductor structure 100*a* shown along line A-A' in FIG. 1E, in accordance with some embodiments.

Figure 2B:
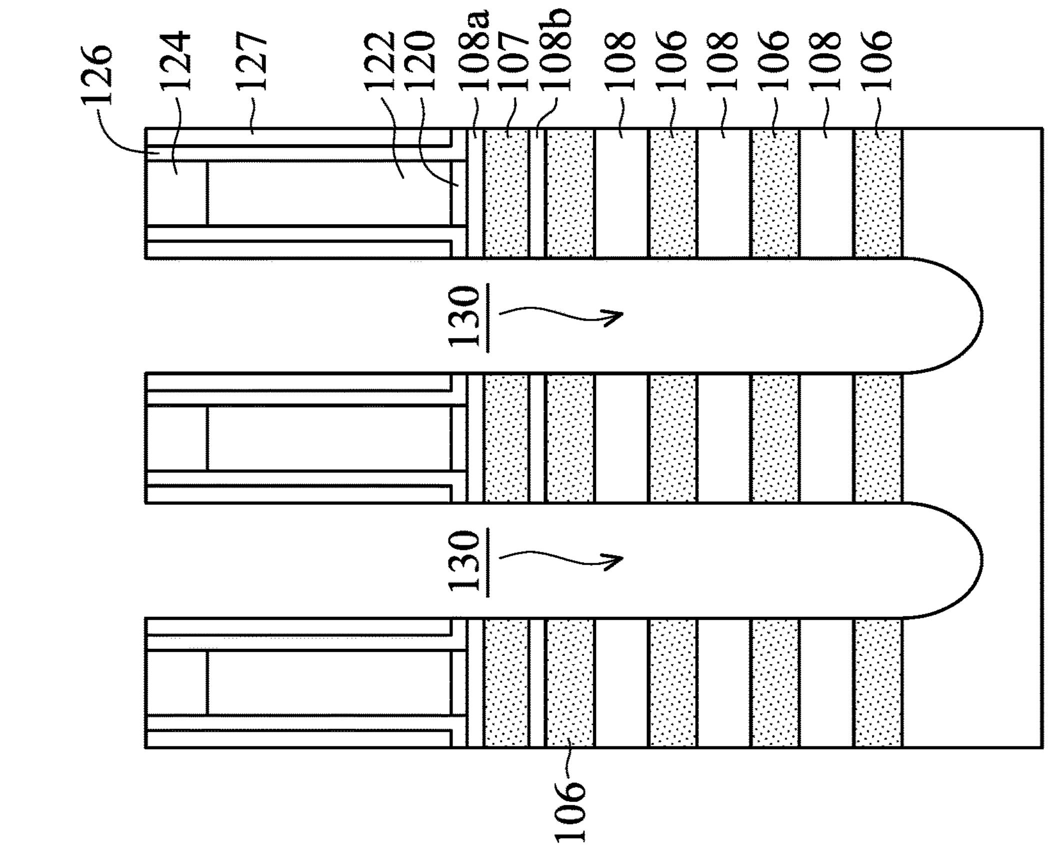
FIGS. 2A to 2M illustrate cross-sectional representations of various stages of manufacturing the semiconductor structure shown along line A-A' in FIG. 1E, in accordance with some embodiments.
Figure 2A:
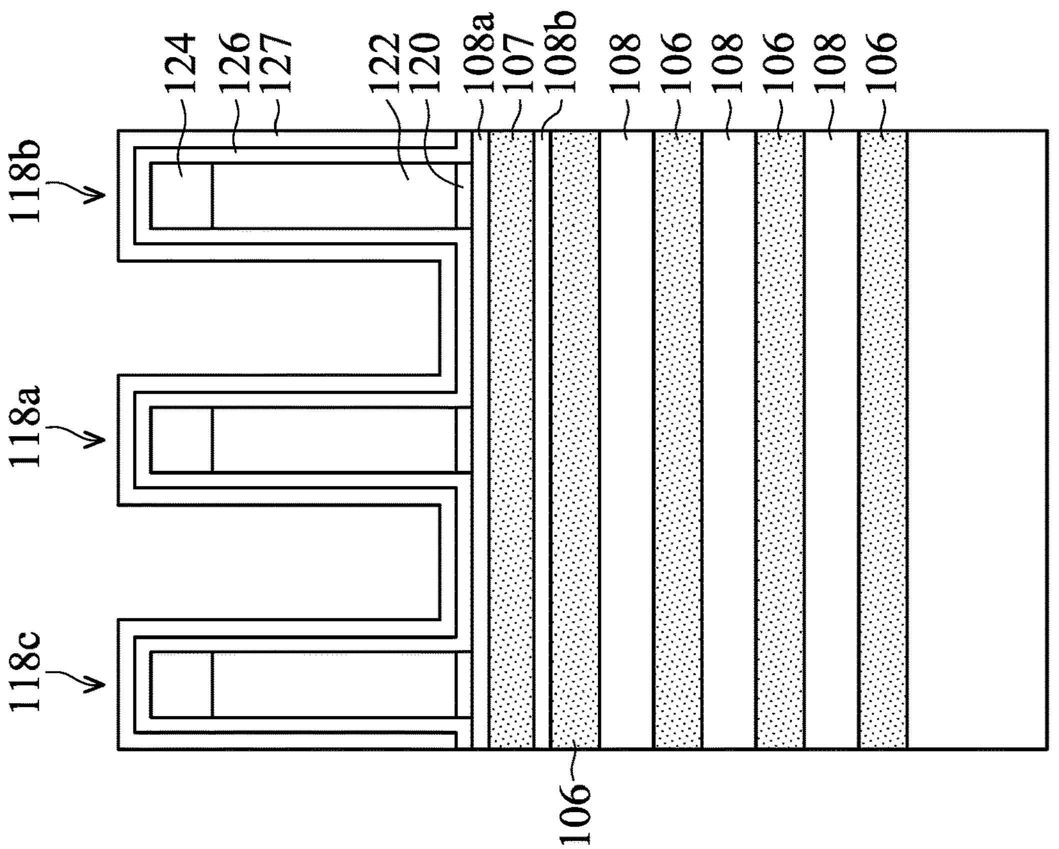

More specifically, FIG. 2A illustrates the cross-sectional representation shown along line A-A" in FIG. 1E. The first gate spacers 126 and the second gate spacer layers 127 are formed on opposites sidewall surfaces of the first dummy gate structure 118*a*, the second dummy gate structure 118*b* and the third dummy gate structure 118*c*. The first gate spacer layer 126 is in direct contact with top second semiconductor material layer 108*a*.

Next, as shown in FIG. 2B, after the first gate spacer layers 126, the second gate spacer layers 127 and the fin spacer layers 128 are formed, the source/drain (S/D) regions of the fin structure 104 are recessed to form source/drain (S/D) recesses 130, as shown in in accordance with some embodiments. More specifically, the first semiconductor material layers 106, the second semiconductor material layers 108 and the third semiconductor material layers 107 not covered by first dummy gate structure 118*a*, the second dummy gate structure 118*b*, the third dummy gate structure 118*c*, the first gate spacer layers 126 and the second gate spacer layers 127 are removed, in accordance with some embodiments. In addition, some portions of the base fin structure 105 are also recessed to form curved top surfaces, as shown in FIG. 2B in accordance with some embodiments.

In some embodiments, the first fin structure 104*a* and the second fin structure 104*b* are recessed by performing an etching process. The etching process may be an anisotropic etching process, such as dry plasma etching, and the first dummy gate structure 118*a*, the second dummy gate structure 118*b*, the third dummy gate structure 118*c*, the first gate spacer layers 126 and the second gate spacer layers 127 are used as etching masks during the etching process. In some embodiments, the fin spacer layers 128 are also recessed to form lowered fin spacer layers 128'.

Figure 2D:
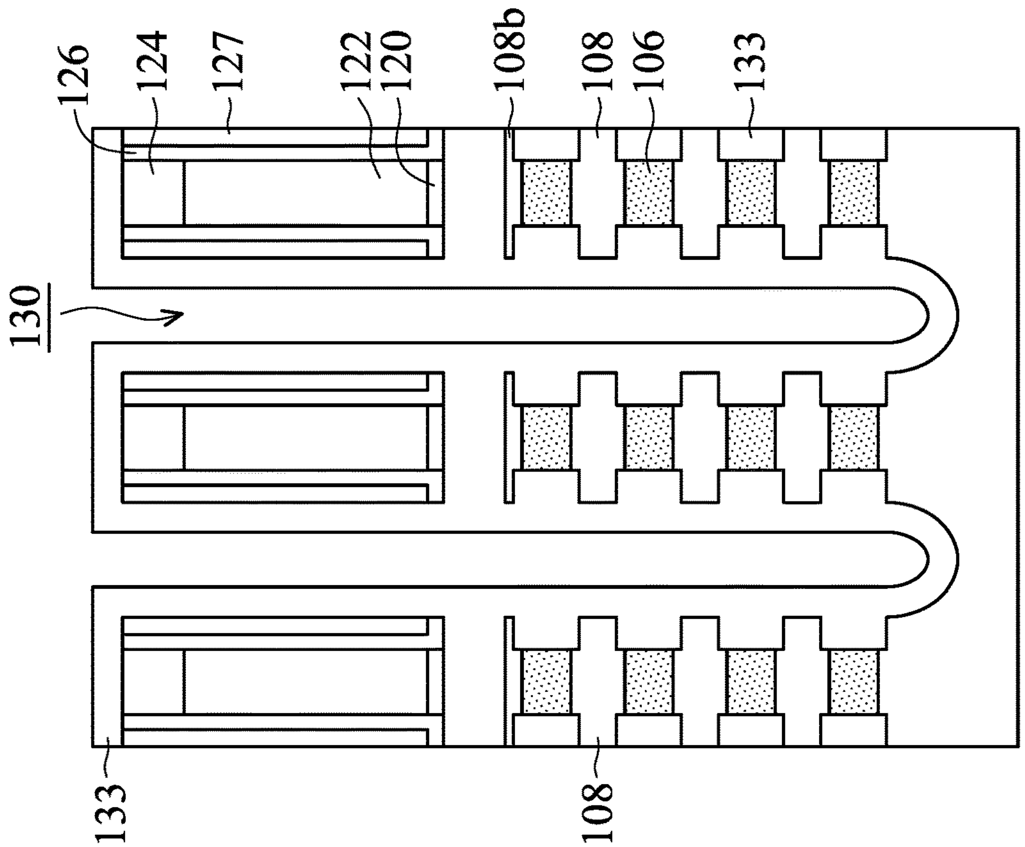
Figure 2C:
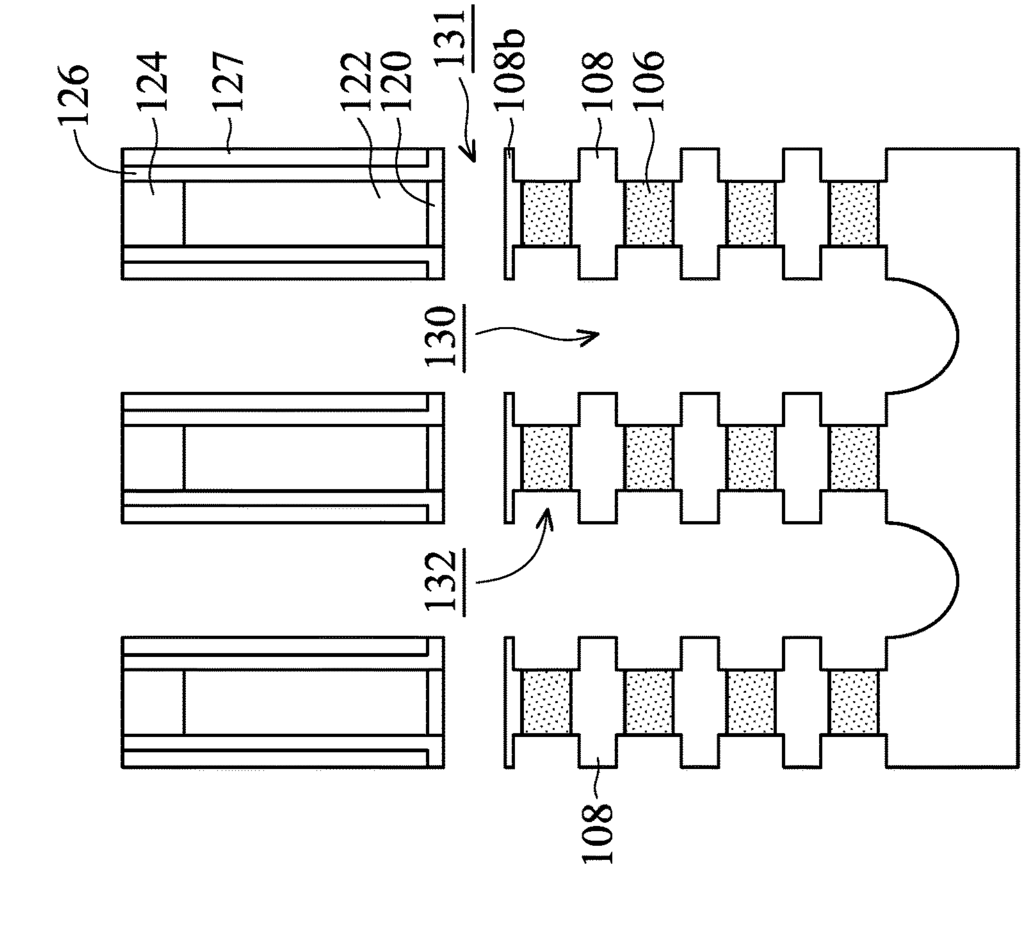

Afterwards, as shown in FIG. 2C, after the source/drain (S/D) recesses 130 are formed, a portion of the first semiconductor material layers 106 exposed by the source/drain recesses 130 are laterally recessed to form notches 132, in accordance with some embodiments. In addition, the third semiconductor material layer 107 is removed to form a trench 131 while the portion of the first semiconductor material layers 106 is removed.

Although the second semiconductor material layer 108 with respect to the third semiconductor material layer 107 has a high etching selectivity, the second semiconductor material layer 108 may be slightly etched when the third semiconductor material layer 107 is removed. The top second semiconductor material layer 108*a* is completely removed while the third semiconductor material layer 107 is removed since the top second semiconductor material layer 108*a* is thin. In addition, the bottom second semiconductor material layer 108*b* is also slightly removed.

Furthermore, the first semiconductor material layer 106 with respect to the third semiconductor material layer 107 has a high etching selectivity. The third semiconductor material layers 107 have a greater etching rate (or etching amount) than the first semiconductor material layer 106. The portion of the first semiconductor material layer 106 is removed when the entirety of the third semiconductor material layer 107 is removed.

In some embodiments, an etching process is performed on the semiconductor structure 100*a* to laterally recess the first semiconductor material layers 106 of the fin structure 104 from the source/drain recesses 130. In some embodiments, during the etching process, the first semiconductor material layers 106 have a greater etching rate (or etching amount) than the second semiconductor material layers 108, thereby forming notches 132 between adjacent second semiconductor material layers 108. In some embodiments, the etching process is an isotropic etching such as dry chemical etching, remote plasma etching, wet chemical etching, another suitable technique, and/or a combination thereof.

Next, as shown in FIG. 2D, inner spacer material 133 is formed in the trench 131 and the notches 132 between the second semiconductor material layers 108, in accordance with some embodiments.

In some embodiments, the inner spacer material 133 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof. In some embodiments, the inner spacer material 133 are formed by a deposition process, such as chemical vapor deposition (CVD) process, atomic layer deposition (ALD) process, another applicable process, or a combination thereof.

Figure 2F:
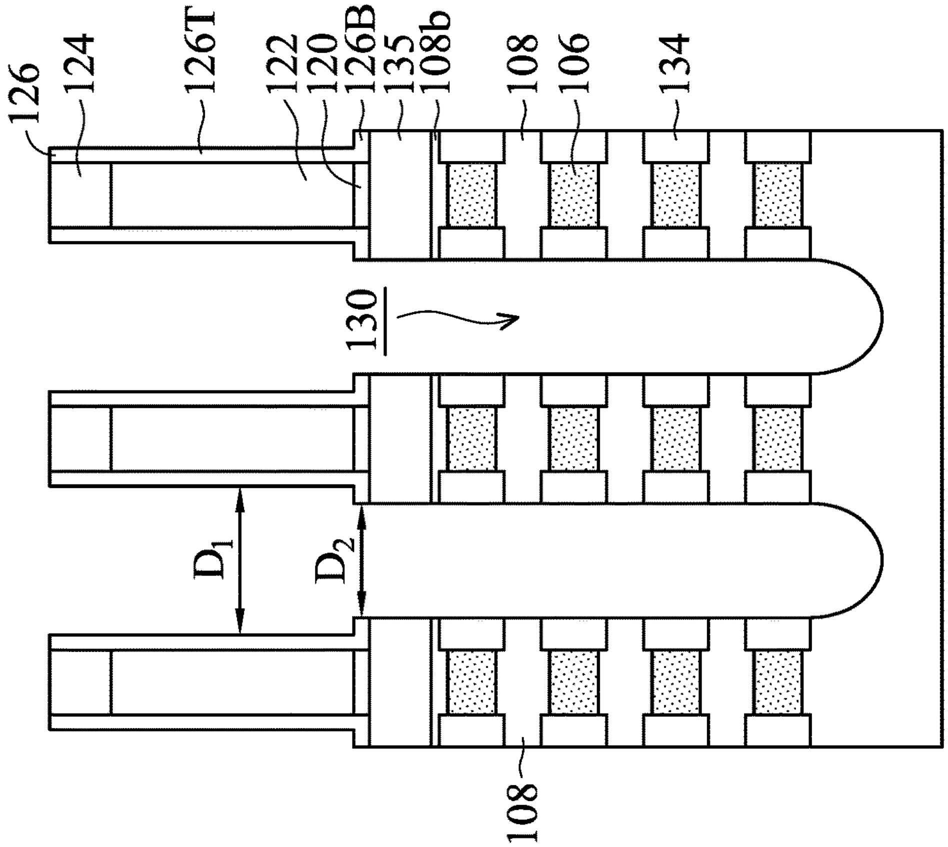
Figure 2E:
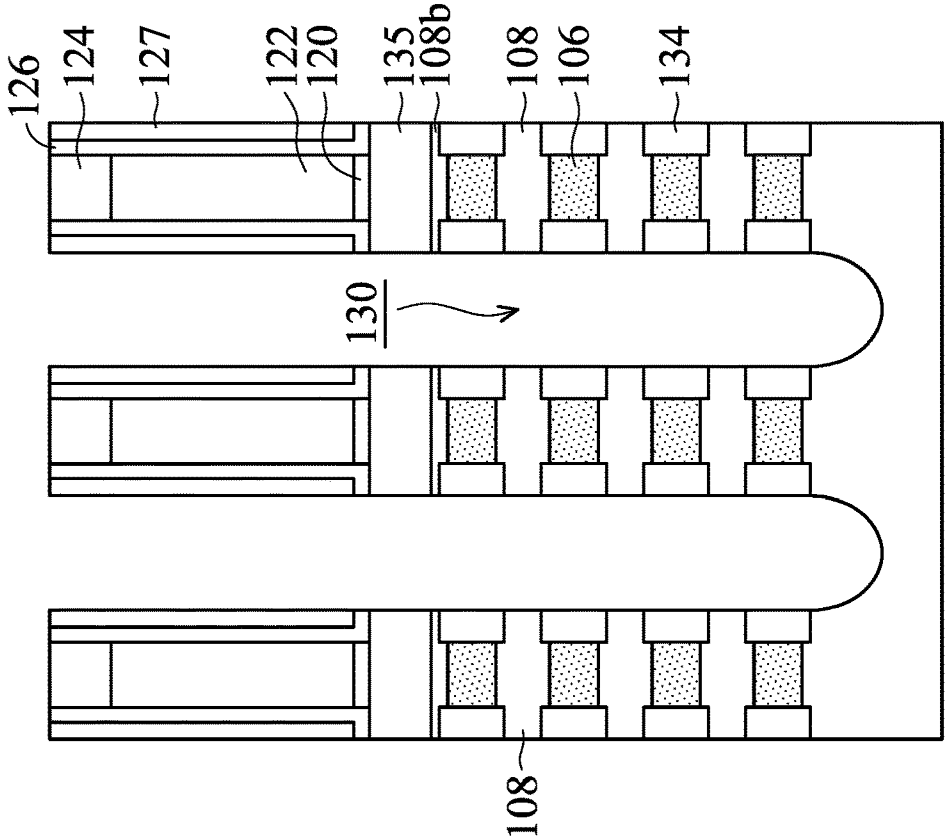

Afterwards, as show in FIG. 2E, a portion of the inner spacer material 133 is removed to form a hard mask layer 135 in the trench 131 and the inner spacer layers 134 in the notches, in accordance with some embodiments.

The hard mask layer 135 is directly above the inner spacer layers 134. The hard mask layer 135 is used to control the height of the S/D structures 136 (formed later). The bottom second semiconductor material layers 108*b* is directly below and in direct contact with the hard mask layer 135. The hard mask layer 135 is separated from the topmost inner spacer layer 134 by the bottom second semiconductor material layers 108*b*.

The inner spacer layers 134 are configured to separate the source/drain (S/D) structures and the gate structures formed in subsequent manufacturing processes in accordance with some embodiments. The hard mask layer 135 and the inner spacer layers 134 are formed by the same process and made of the same material. The outer sidewall surface of the hard mask layer 135 is substantially aligned with the outer sidewall surface of the inner spacer layer 134. The outer sidewall surface of the hard mask layer 135 is substantially aligned with the outer sidewall surface of the first gate spacer layer 126 and the outer sidewall surface of the second gate spacer layer 127.

Afterwards, as shown in FIG. 2F, after the inner spacer layers 134 are formed, the second gate spacer layer 127 is removed, in accordance with some embodiments. The second gate spacer layer 127 is removed to enlarge the opening above the S/D recess 130. AS a result, the first gate spacer layer 126 is left, and the first gate spacer layer 126 has a L-shaped structure.

The second gate spacer layer 127 and the first gate spacer layer 126 are made of different materials. The first gate spacer layer 126 has a high etching selectivity with respect to the second gate spacer layer 127. The second gate spacer layer 127 have a greater etching rate (or etching amount) than the first gate spacer layer 126. The portion of the first gate spacer layer 126 is not removed when the entirety of the second gate spacer layer 127 is removed.

The first gate spacer layer 126 has a top portion 126T (or the vertical portion) and a bottom portion 126B (or the horizontal portion). The sidewall surface of the bottom portion 126B (or the horizontal portion) of the first gate spacer layer 126 extends beyond the sidewall surface of the top portion 126T (or the vertical portion) of the first gate spacer layer 126. Furthermore, the outer sidewall surface of the inner spacer layer 134 extends beyond the sidewall surface of the top portion 126T (or the vertical portion) of the first gate spacer layer 126.

The sidewall surface of the bottom portion 126B (or the horizontal portion) of the first gate spacer layer 126 is substantially aligned with the sidewall surface of the hard mask layer 135. The sidewall surface of the inner spacer layer 134 extends beyond the sidewall surface of the top portion 126T (or the vertical portion) of the gate spacer layer 126.

There is a first distance $D_1$ between the top portion 126T of the first gate spacer 126 on the first dummy gate structure 118*a* and the top portion 126T of the first gate spacer 126 on the second dummy gate structure 118*b*. There is a second distance $D_2$ between the bottom portion 126B of the first gate spacer 126 on the first dummy gate structure 118*a* and bottom portion 126B of the first gate spacer 126 on the second dummy gate structure 118*b*. The first distance $D_1$ is greater than the second distance $D_2$.

Figure 2G:
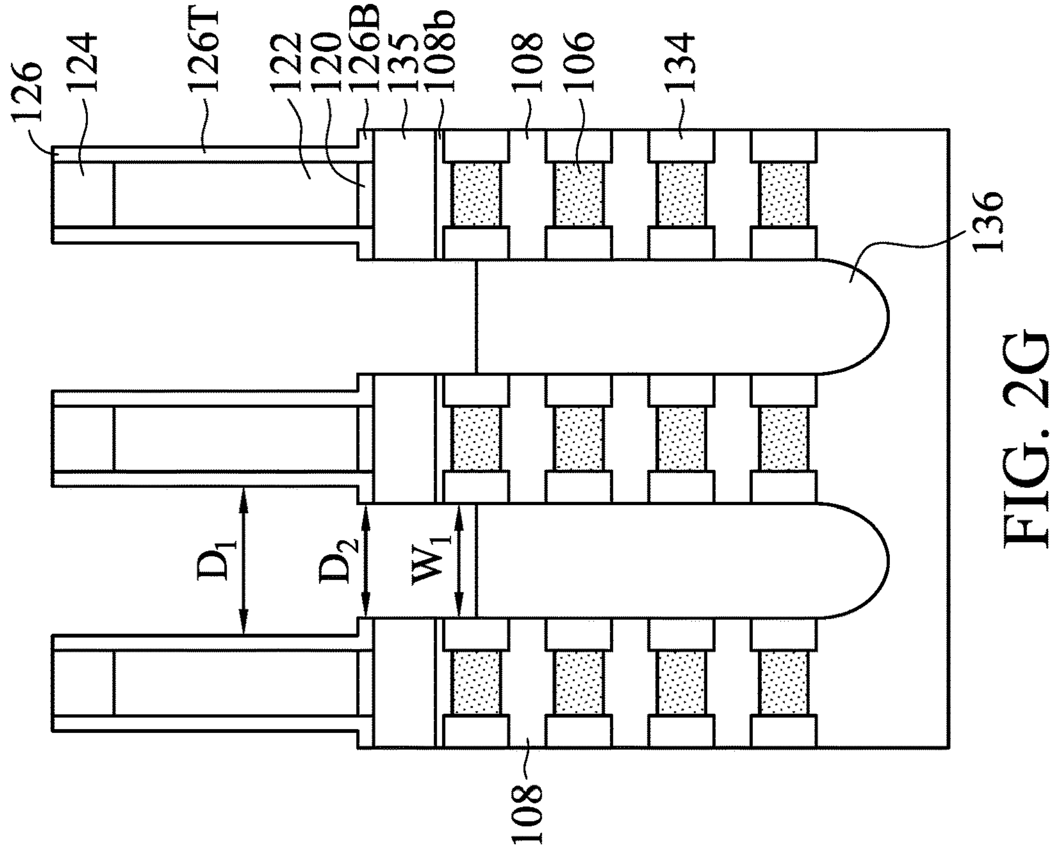

Next, as shown in FIG. 2G, source/drain (S/D) structures 136 are formed in the S/D recesses 130, in accordance with some embodiments. The top surface of the S/D structure 136 is lower than the top surface of the hard mask layer 135. In addition, the top surface of the S/D structure 136 is lower than the top surface of the topmost inner spacer layer 134. The top surface of the S/D structure 136 is lower than the bottom surface of the first gate spacer layer 126.

The S/D structure 136 has a first width $W_1$. In some embodiments, the first distance $D_1$ is greater than the first width $W_1$. The larger first distance $D_1$ provides a larger space for the diffusion of the growth gas into the S/D recess 130 when forming the S/D structure 136. If the second gate spacer layer 127 is not removed, the formation gas is hard to diffuse into the S/D recess 130 to form the S/D structure 136 (in FIG. 2G). The formation window is enlarged by removing the second gate spacer layer 127 to facilitate the formation of the S/D structure 136 (in FIG. 2G).

In some embodiments, the source/drain (S/D) structures 136 are formed using an epitaxial growth process, such as Molecular beam epitaxy (MBE), Metal-organic Chemical Vapor Deposition (MOCVD), Vapor-Phase Epitaxy (VPE), another applicable epitaxial growth process, or a combination thereof. In some embodiments, the source/drain (S/D) structures 136 are made of any applicable material, such as Ge, Si, GaAs, AlGaAs, SiGe, GaAsP, SiP, SiC, SiCP, or a combination thereof.

In some embodiments, the source/drain (S/D) structures 136 are doped in-situ during the epitaxial growth process. For example, the source/drain (S/D) structure 136 may be the epitaxially grown SiGe doped with boron (B). For example, the source/drain (S/D) structure 136 may be the epitaxially grown Si doped with carbon to form silicon: carbon (Si:C) source/drain features, phosphorous to form silicon:phosphor (Si:P) source/drain features, or both carbon and phosphorous to form silicon carbon phosphor (SiCP) source/drain features. In some embodiments, the source/ drain (S/D) structure 136 is doped in one or more implantation processes after the epitaxial growth process.

Figure 2H:
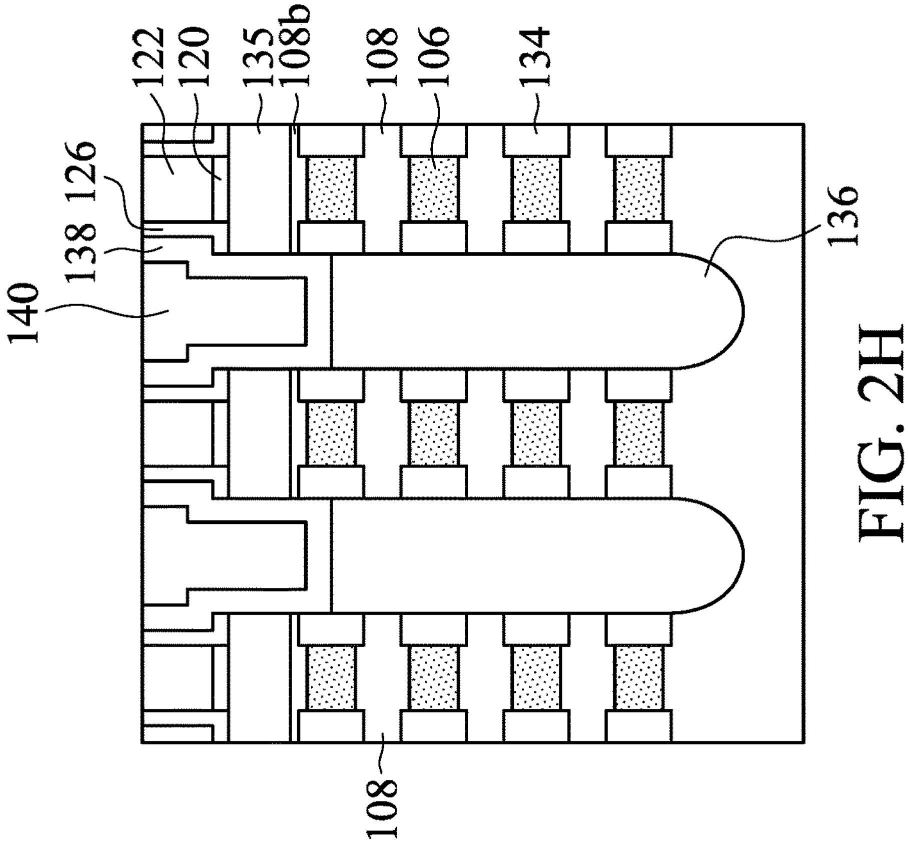

Afterwards, as shown in FIG. 2H, a contact etch stop layer (CESL) 138 is conformally formed to cover the S/D structures 136, and an interlayer dielectric (ILD) layer 140 is formed over the contact etch stop layers 138, in accordance with some embodiments.

In some embodiments, the contact etch stop layer 138 is made of a dielectric materials, such as silicon nitride, silicon oxide, silicon oxynitride, another suitable dielectric material, or a combination thereof. The dielectric material for the contact etch stop layers 138 may be conformally deposited over the semiconductor structure by performing chemical vapor deposition (CVD), ALD, other application methods, or a combination thereof.

The ILD layer 140 may include multilayers made of multiple dielectric materials, such as silicon oxide, silicon nitride, silicon oxynitride, phosphosilicate glass (PSG), borophosphosilicate glass (BPSG), and/or other applicable low-k dielectric materials. The ILD layer 140 may be formed by chemical vapor deposition (CVD), physical vapor deposition, (PVD), atomic layer deposition (ALD), or other applicable processes.

After the contact etch stop layer 138 and the ILD layer 140 are deposited, a planarization process such as CMP or an etch-back process may be performed until the gate electrode layers 122 of the first dummy gate structure 118*a* and the second dummy gate structure 118*b* and the third dummy gate structure 118*c* are exposed, as shown in FIG. 2H, in accordance with some embodiments.

Figure 2J:
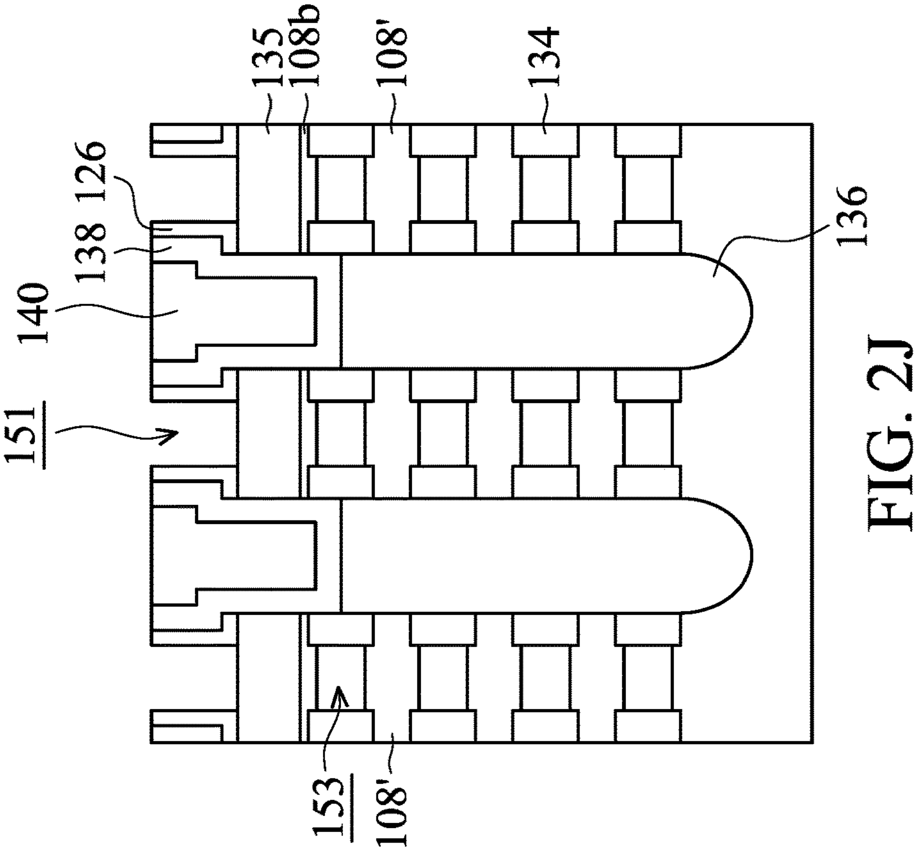
Figure 2I:
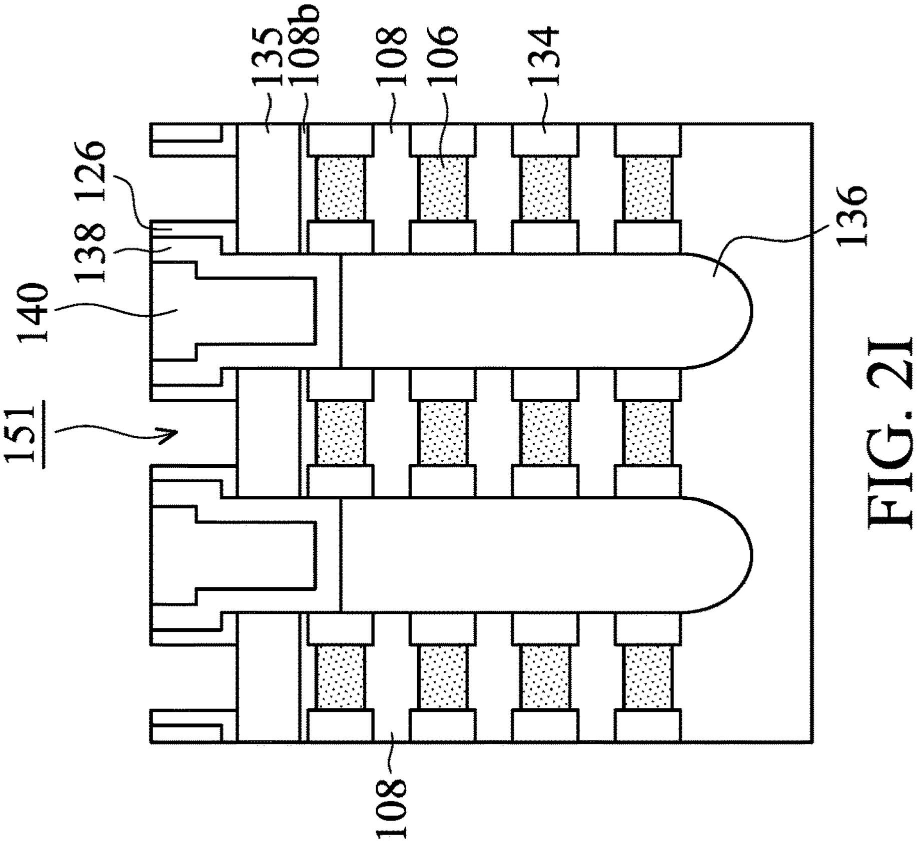

Afterwards, as shown in FIG. 2I, after the contact etch stop layer 138 and the ILD layer 140 are formed, the dummy gate electrode layer 122 and the dummy gate dielectric layer 120 are removed to form a trench 151 by the removal process, in accordance with some embodiments. As a result, the top surface of the hard mask layer 135 is exposed by the trench 151.

The removal process may include one or more etching processes. For example, when the dummy gate electrode layer 122 is polysilicon, a wet etchant such as a tetramethylammonium hydroxide (TMAH) solution may be used to selectively remove the dummy gate electrode layer 122. Afterwards, the dummy gate dielectric layer 120 may be removed using a plasma dry etching, a dry chemical etching, and/or a wet etching.

Next, as shown in FIG. 2J, the first semiconductor material layers 106 are removed to form nanostructures 108' (or channel layers 108') with the second semiconductor material layers 108, in accordance with some embodiments. As a result, gaps 153 are formed adjacent to the nanostructures 108' (or channel layers 108').

Figure 2L:
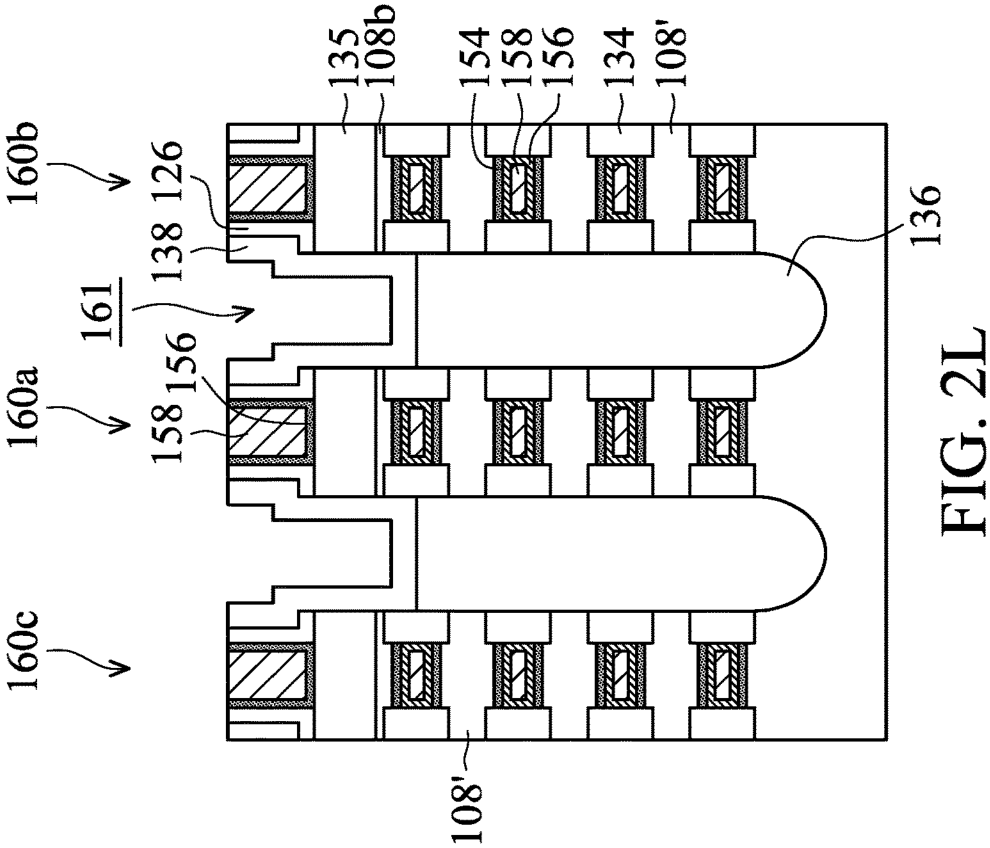
Figure 2K:
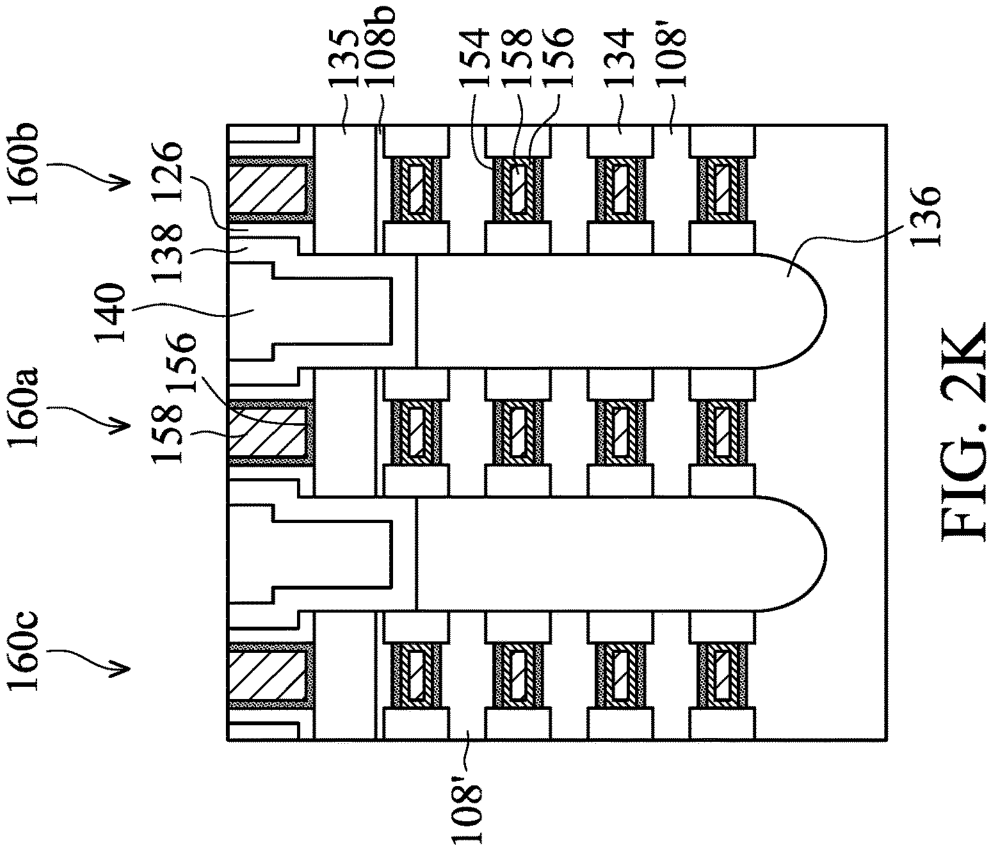

Afterwards, as shown in FIG. 2K, after the nanostructures 108' are formed, the interfacial layer 154, the gate dielectric layer 156, and the gate electrode layer 158 are formed in the trench 151 and the gaps 153, in accordance with some embodiments.

After the interfacial layers 154, the gate dielectric layers 156, and the gate electrode material are formed, a planarization process such as CMP or an etch-back process may be performed.

After the nanostructures 108' are formed, the first gate structure 160*a*, the second gate structure 160*b* and the third gate structure 160*c* are formed wrapped around the nanostructures 108'. The first gate structure 160*a* and the second gate structure 160*b*, and the third gate structure 160*c* wrap around the nanostructures 108' to form gate-all-around transistor structures, in accordance with some embodiments. In some embodiments, the first gate structure 160*a* includes the interfacial layer 154, the gate dielectric layer 156, and the gate electrode layer 158. In some embodiments, the second gate structure 160*b* includes the interfacial layer 154, a gate dielectric layer 156, and the gate electrode layer 158. In some embodiments, the third gate structure 160*c* includes the interfacial layer 154, a gate dielectric layer 156, and the gate electrode layer 158.

In some embodiments, the interfacial layers 154 are oxide layers formed around the nanostructures 108' and on the top of the base fin structure 105. In some embodiments, the interfacial layers 154 are formed by performing a thermal process.

In some embodiments, the gate dielectric layers 156 are formed over the interfacial layers 154, so that the nanostructures 108' are surrounded (e.g. wrapped) by the gate dielectric layers 156. In addition, the gate dielectric layers 156 also cover the sidewalls of the gate spacer layers 126 and the inner spacer layers 134 in accordance with some embodiments. In some embodiments, the gate dielectric layers 156 are made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, another suitable high-k dielectric material, or a combination thereof. In some embodiments, the gate dielectric layers 156 are formed using chemical vapor deposition (CVD), atomic layer deposition (ALD), another applicable method, or a combination thereof.

In some embodiments, the gate electrode layer 158 is formed on the gate dielectric layer 156. In some embodiments, the gate electrode layer 158 are made of one or more layers of conductive material, such as aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, or a combination thereof.

In some embodiments, the gate electrode layer 158 is formed using chemical vapor deposition (CVD), atomic layer deposition (ALD), electroplating, another applicable method, or a combination thereof. Other conductive layers, such as work function metal layers, may also be formed in the gate electrode layer 158, although they are not shown in the figures. In some embodiments, the n-work function layer includes copper (Cu), titanium (Ti), silver (Ag), aluminum (Al), tantalum carbide (TaC), titanium aluminum alloy (TiAl), titanium aluminum nitride (TiAlN), tantalum carbon nitride (TaCN), tantalum silicon nitride (TaSiN), manganese (Mn), zirconium (Zr) or a combination thereof. In some embodiments, the p-work function layer includes titanium nitride (TiN), tantalum nitride (TaN), tantalum carbide (TaC), molybdenum nitride, tungsten nitride (WN), ruthenium (Ru) or a combination thereof.

Next, as shown in FIG. 2L, the ILD layer 140 is removed to form an opening 161 and to expose the CESL 138, in accordance with some embodiments. The top surface of the S/D structure 136 is exposed by the opening 161. The opening 161 may be formed using a photolithography process and an etching process. In some other embodiments, a portion of the ILD layer 140 is remaining on CESL 138.

Figure 2M:
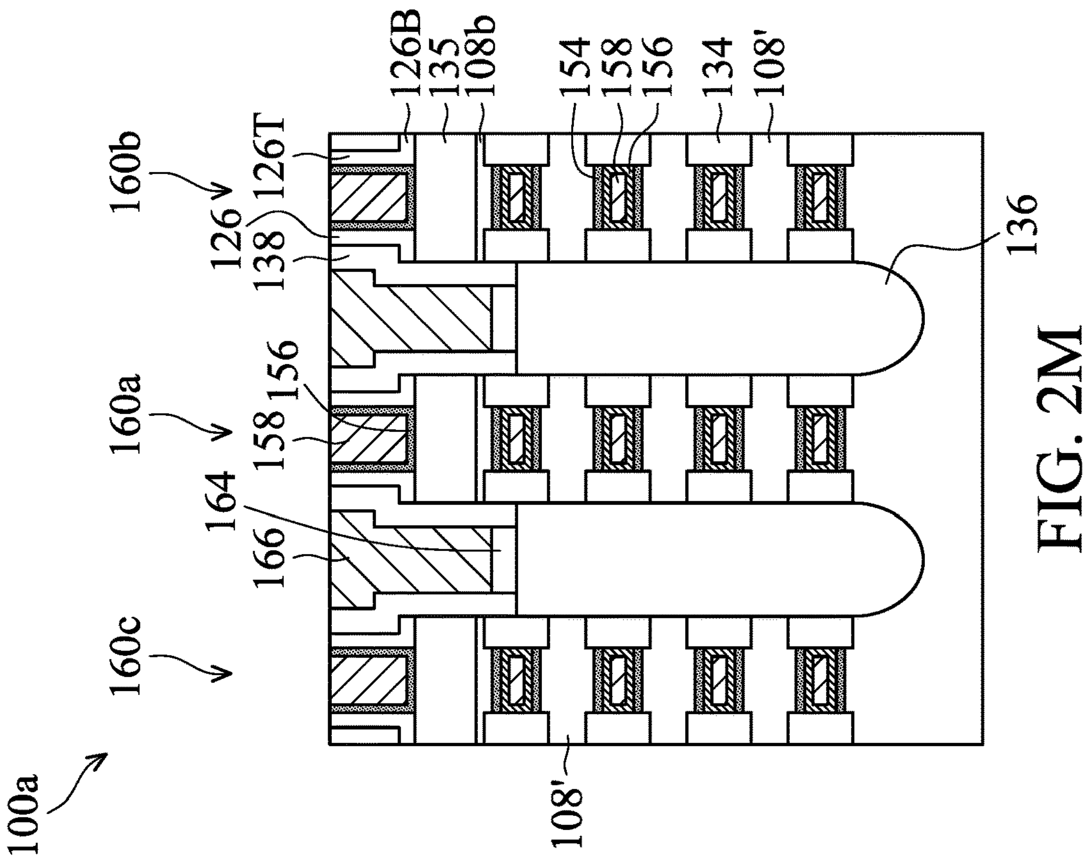

Afterwards, as shown in FIG. 2M, a silicide layer 164 and an S/D contact structure 166 are formed over the S/D structure 136, in accordance with some embodiments. The S/D contact structure 166 is electrically connected to the S/D structure 136 by the silicide layer 164. In some embodiments, the S/D contact structure 166 has a T-shaped structure.

In some embodiments, the opening 161 is formed through the contact etch stop layer 138 to expose the top surfaces of the S/D structures 136, and then the silicide layers 164 and the S/D contact structure 166 is formed in the opening 161.

The silicide layer 164 may be formed by forming a metal layer over the top surfaces of the S/D structure 136 and annealing the metal layer so the metal layer reacts with the S/D structure 136 to form the silicide layer 164. The unreacted metal layer may be removed after the silicide layer 164 is formed.

The S/D contact structure 166 may include a barrier layer and a conductive layer. In some other embodiments, the S/D contact structure 166 does not include a barrier layer. In some embodiments, the barrier layer is made of titanium (Ti), titanium nitride (TiN), tantalum (Ta), tantalum nitride (TaN), or another applicable material. In some embodiments, the barrier layer is formed by using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the conductive layer is made of tungsten (W), ruthenium (Ru), molybdenum (Mo), or the like. In some embodiments, the conductive layer is formed by performing a deposition process, such as chemical vapor deposition (CVD), physical vapor deposition, (PVD), atomic layer deposition (ALD), or other applicable processes.

It should be noted that the hard mask layer 135 is formed on the inner spacer layers 134, and the hard mask layer 135 and the inner spacer layers 134 are made of the same material. The top surface of the hard mask layer 135 is higher than the top surface of the S/D structure 136.

In some embodiments, the bottom surface of the S/D contact structure 166 is lower than the top surface of the hard mask layer 135. In addition, the bottom surface of the CESL 138 is lower than the bottom surface of the first gate spacer layer 126. The bottom surface of the CESL 138 is lower than the bottom surface of hard mask layer 135.

It should be noted that the second spacer layer 127 is removed to enlarge the first distance $D_1$ (shown in FIGS. 2F and 2G) between the top portion 126T of the first gate spacer 126 on the first dummy gate structure 118*a* and the top portion 126T of the first gate spacer 126 on the second dummy gate structure 118*b*. The large first distance $D_1$ can help the growth gas to flow into the S/D recess 130. In addition, the unwanted remaining products can easily be removed by forming the large first distance $D_1$. In other words, the second gate spacer layer 127 is removed to enlarge the formation widow for forming the S/D structures 136 (in FIG. 2G). Therefore, the formation process and the quality of the S/D structures 136 are improved. Therefore, the semiconductor structure 100*a* is improved.

Figure 3:
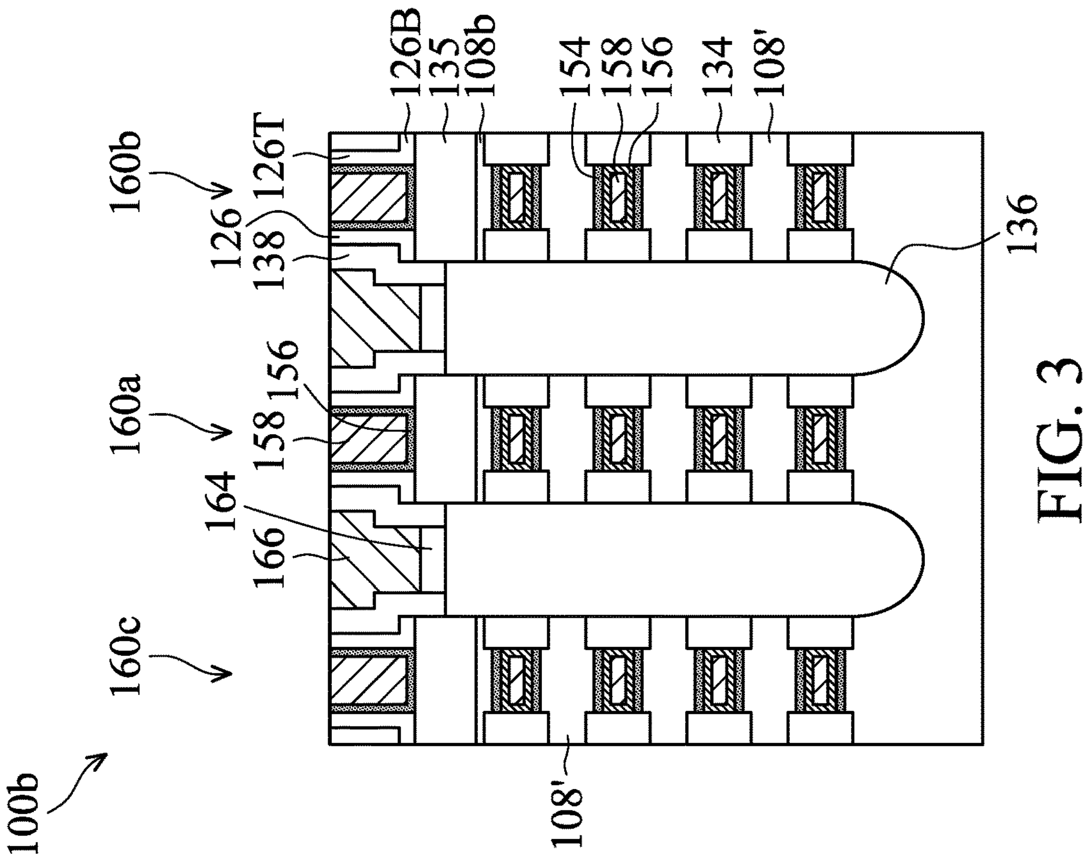
FIG. 3 illustrates a cross-sectional representation of a semiconductor structure, in accordance with some embodiments.

FIG. 3 illustrates a cross-sectional representation of a semiconductor structure 100*b*, in accordance with some embodiments. The semiconductor structure 100*b* of FIG. 3 includes elements that are similar to, or the same as, elements of the semiconductor structure 100*a* of FIG. 2M.

FIG. 3 is are similar to, or the same as, FIG. 2M, the difference between FIG. 3 and FIG. 2M is that the top surface of the S/D structure 136 is higher than the topmost surface of the inner spacer layer 134. The top surface of the S/D structure 136 is lower than the top surface of the hard mask layer 135, but higher than the topmost surface of the inner spacer layer 134. In addition, the top surface of the S/D structure 136 is higher than the top surface of the bottom second semiconductor material layer 108*b*.

FIGS. 4A to 4E illustrate cross-sectional representations of various stages of manufacturing a semiconductor structure 100*c*, in accordance with some embodiments. The semiconductor structure 100*c* of FIGS. 4A-4E includes elements that are similar to, or the same as, elements of the semiconductor structure 100*a* of FIGS. 2A-2M.

Figure 4B:
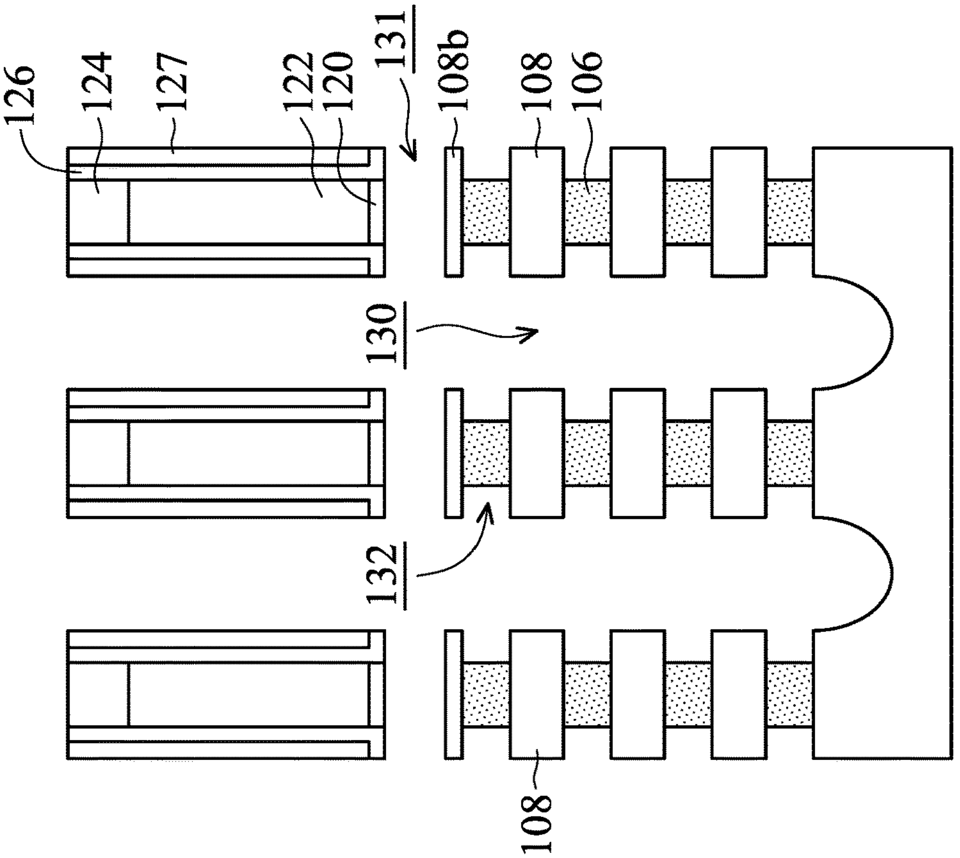
FIGS. 4A to 4E illustrate cross-sectional representations of various stages of manufacturing a semiconductor structure, in accordance with some embodiments.
Figure 4A:
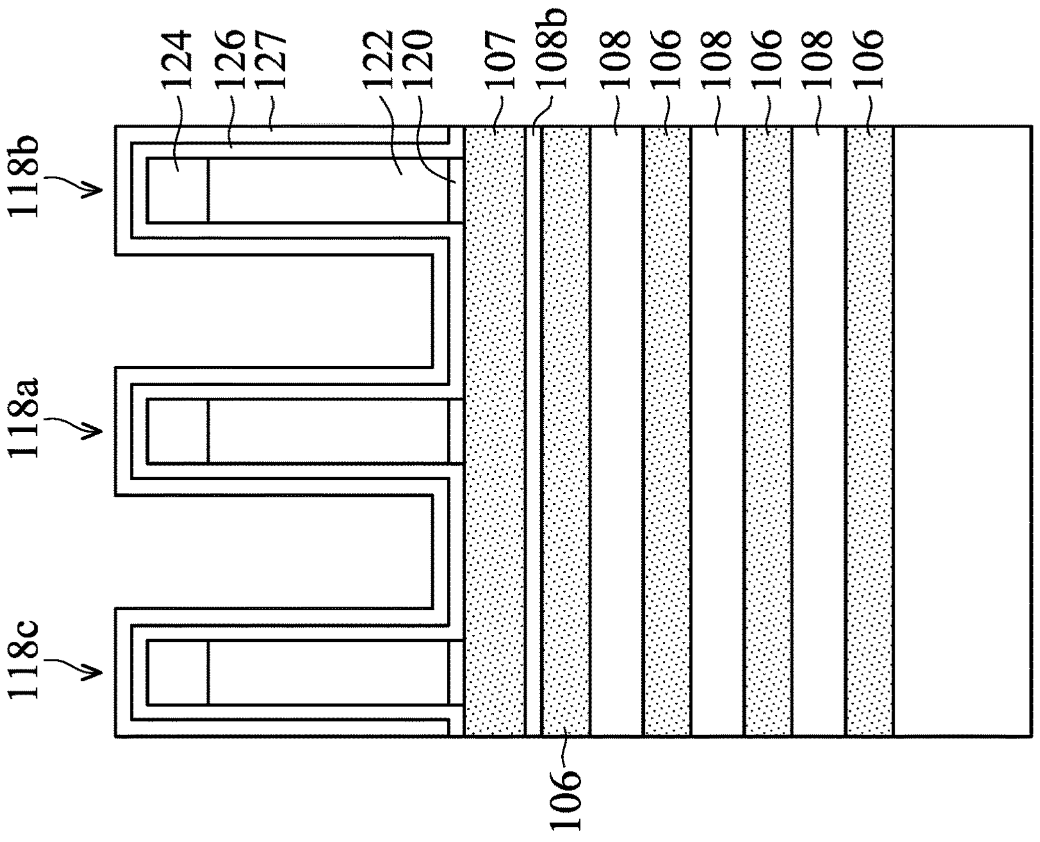

As shown in FIG. 4A, the bottom second semiconductor material layer 108*b* is below and in direct contact with the third semiconductor layer 107, but no top second semiconductor material layer 108*a* is above the third semiconductor layer 107.

Next, as shown in FIG. 4B, after the source/drain (S/D) recesses 130 are formed, a portion of the first semiconductor material layers 106 exposed by the source/drain recesses 130 are laterally recessed to form the notches 132, in accordance with some embodiments. Furthermore, the third semiconductor material layer 107 is removed to form the trench 131.

It should be noted that the second semiconductor material layer 108 has a high etching selectivity with respect to the first semiconductor material layers 106. As a result, the second semiconductor material layer 108 is not removed while the portion of the first semiconductor material layers 106 is removed. Therefore, each of the second semiconductor material layers 108 still has rectangular shape when seen from a cross-sectional view.

Figure 4C:
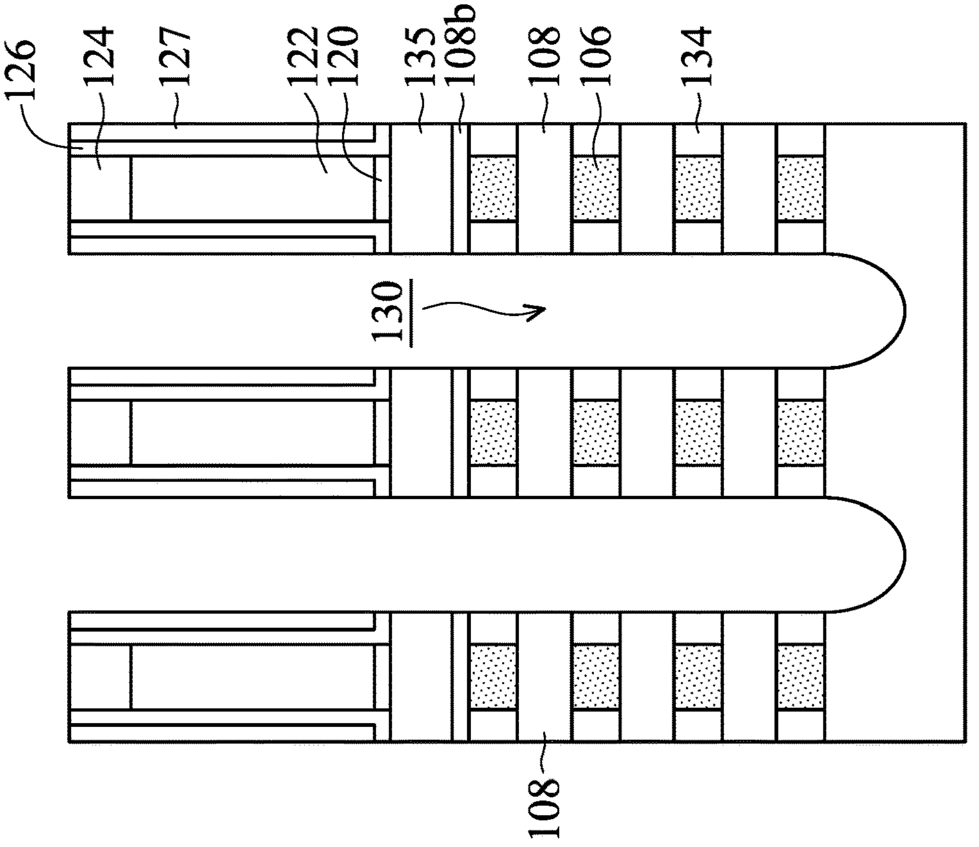

Afterwards, as shown in FIG. 4C, the hard mask layer 135 and the inner spacer layers 134 are formed in the trench 131 and the notches 132, in accordance with some embodiments.

Figure 4D:
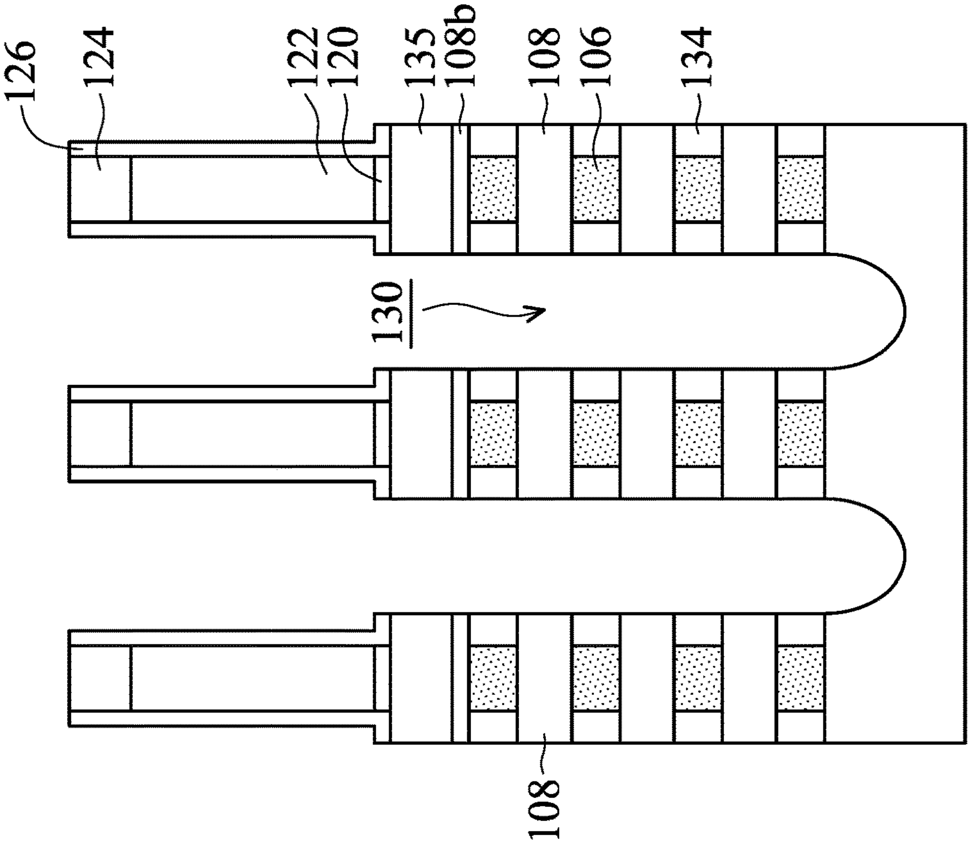
Figure 4E:
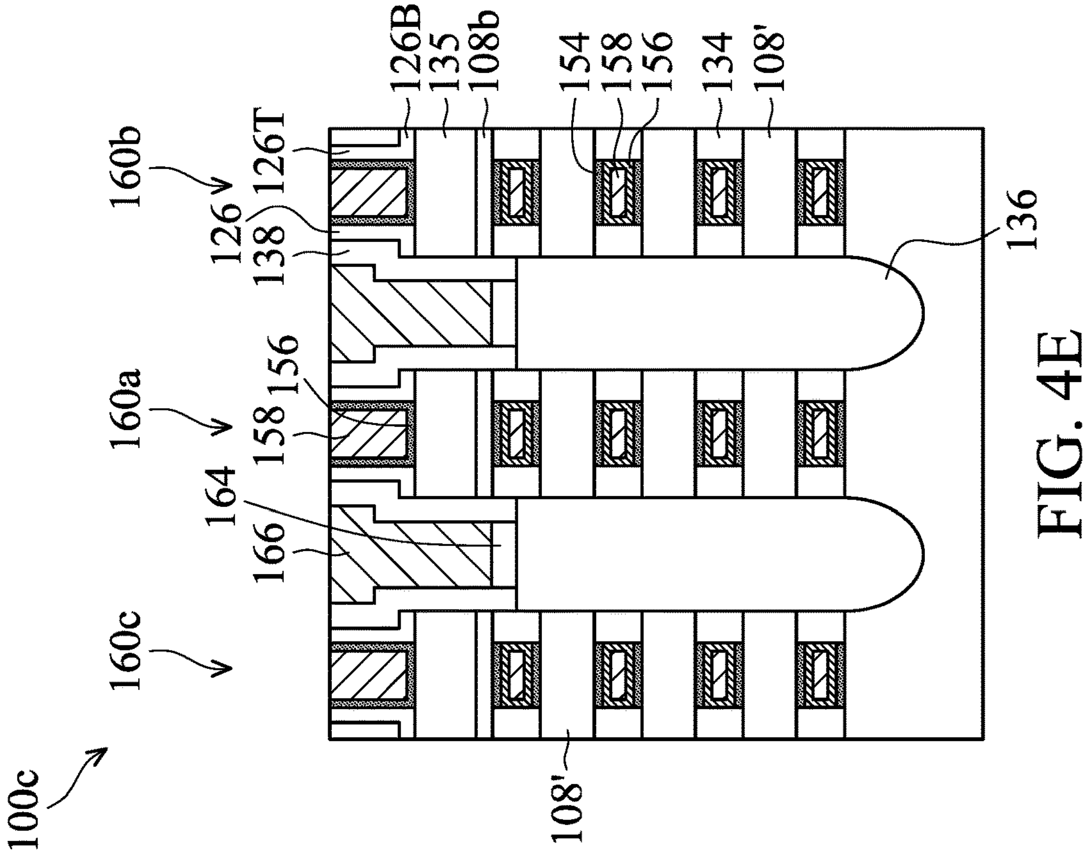

Next, as shown in FIG. 4D, after the inner spacer layers 134 are formed, the second gate spacer layer 127 is removed, in accordance with some embodiments. The second gate spacer layer 127 is removed to enlarge the opening above the S/D recess 130. AS a result, the first gate spacer layer 126 is left, and the first gate spacer layer 126 has a L-shaped structure. The second gate spacer layer 127 is removed to enlarge the formation widow for forming the S/D structures 136 formed later. T Afterwards, as shown in FIG. 4E, after the second gate spacer layer 127 is removed, the CESL 138 and the ILD layer 140 are formed, and the first semiconductor material layers 106 are removed to form nanostructures 108' (or channel layers 108') with the second semiconductor material layers 108, in accordance with some embodiments. Next, the interfacial layer 154, the gate dielectric layer 156, and the gate electrode layer 158 are formed to surround the nanostructures 108'.

Afterwards, the silicide layer 164 and the S/D contact structure 166 are formed over the S/D structure 136. The S/D contact structure 166 has a T-shaped structure when seen from a cross-sectional view.

Figure 5:
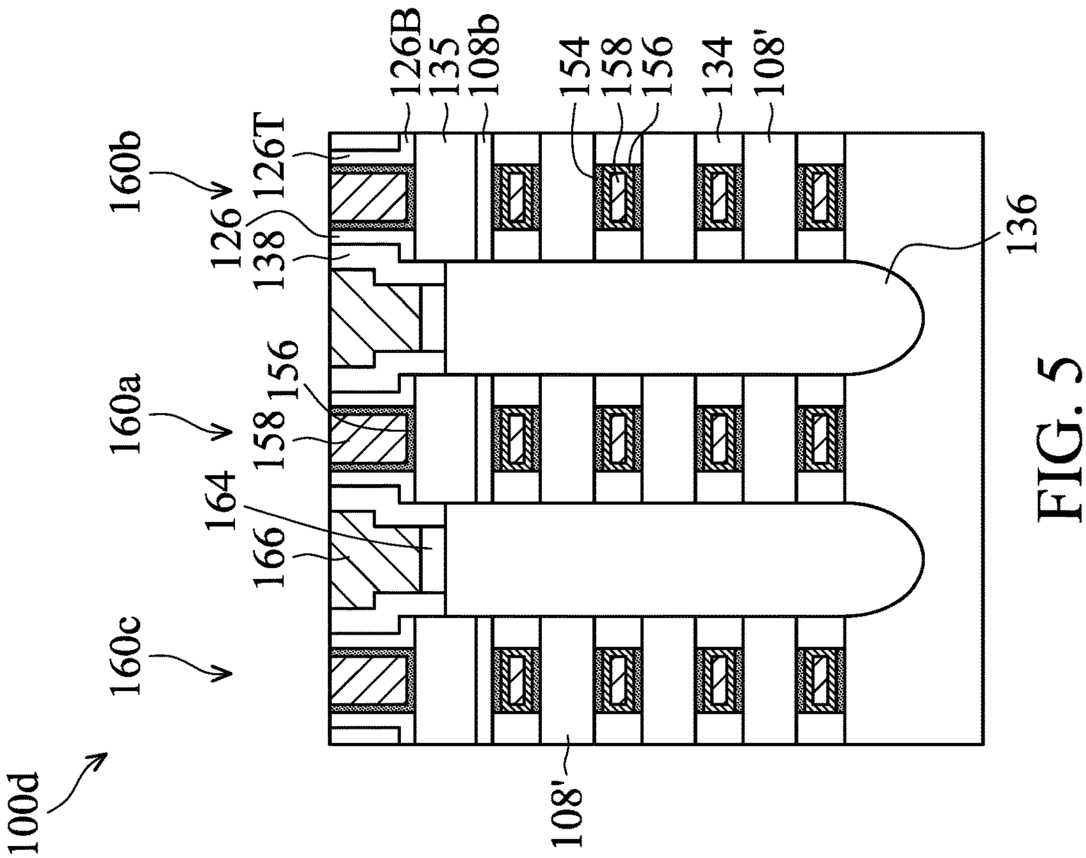
FIG. 5 illustrates a cross-sectional representation of a semiconductor structure, in accordance with some embodiments.

FIG. 5 illustrates a cross-sectional representation of a semiconductor structure 100*d*, in accordance with some embodiments. The semiconductor structure 100*d* of FIG. 5 includes elements that are similar to, or the same as, elements of the semiconductor structure 100*c* of FIG. 4E.

FIG. 5 is are similar to, or the same as, FIG. 4E, the difference between FIG. 5 and FIG. 4E is that the top surface of the S/D structure 136 is higher than the topmost surface of the inner spacer layer 134. The top surface of the S/D structure 136 is lower than the top surface of the hard mask layer 135, but higher than the topmost surface of the inner spacer layer 134.

FIGS. 6A to 6D illustrate cross-sectional representations of various stages of manufacturing a semiconductor structure 100*e*, in accordance with some embodiments. The semiconductor structure 100*e* of FIGS. 6A-6D includes elements that are similar to, or the same as, elements of the semiconductor structure 100*a* of FIGS. 2A-2M.

Figure 6B:
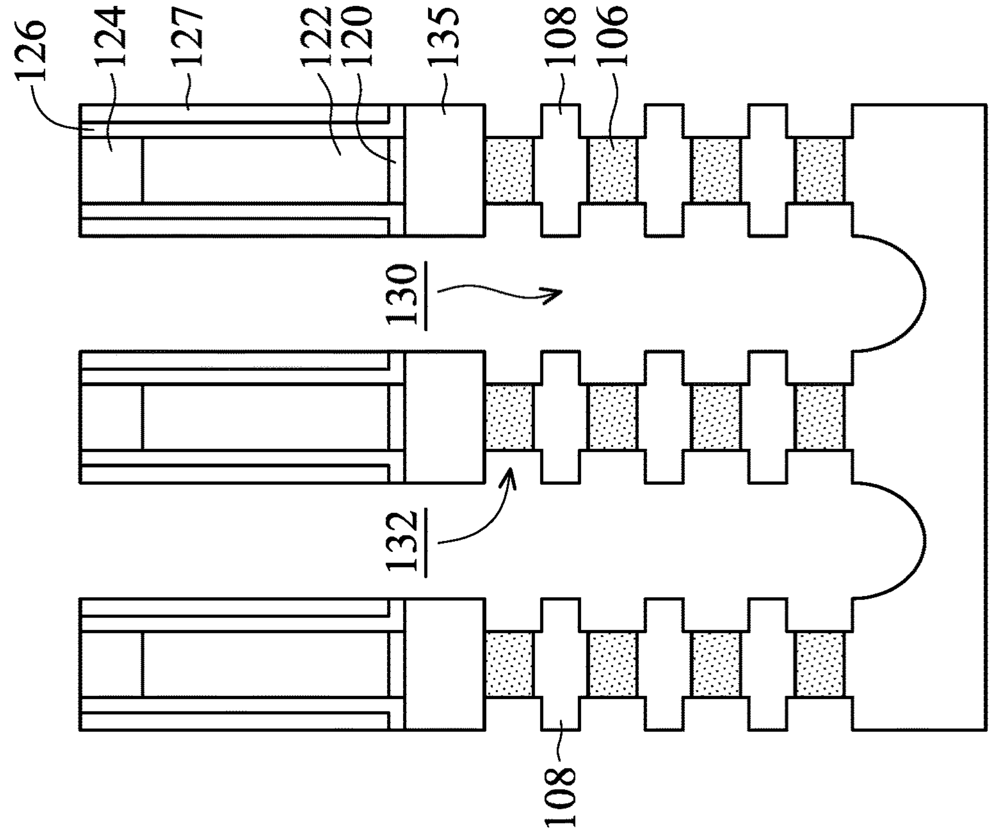
FIGS. 6A to 6D illustrate cross-sectional representations of various stages of manufacturing a semiconductor structure, in accordance with some embodiments.
Figure 6A:
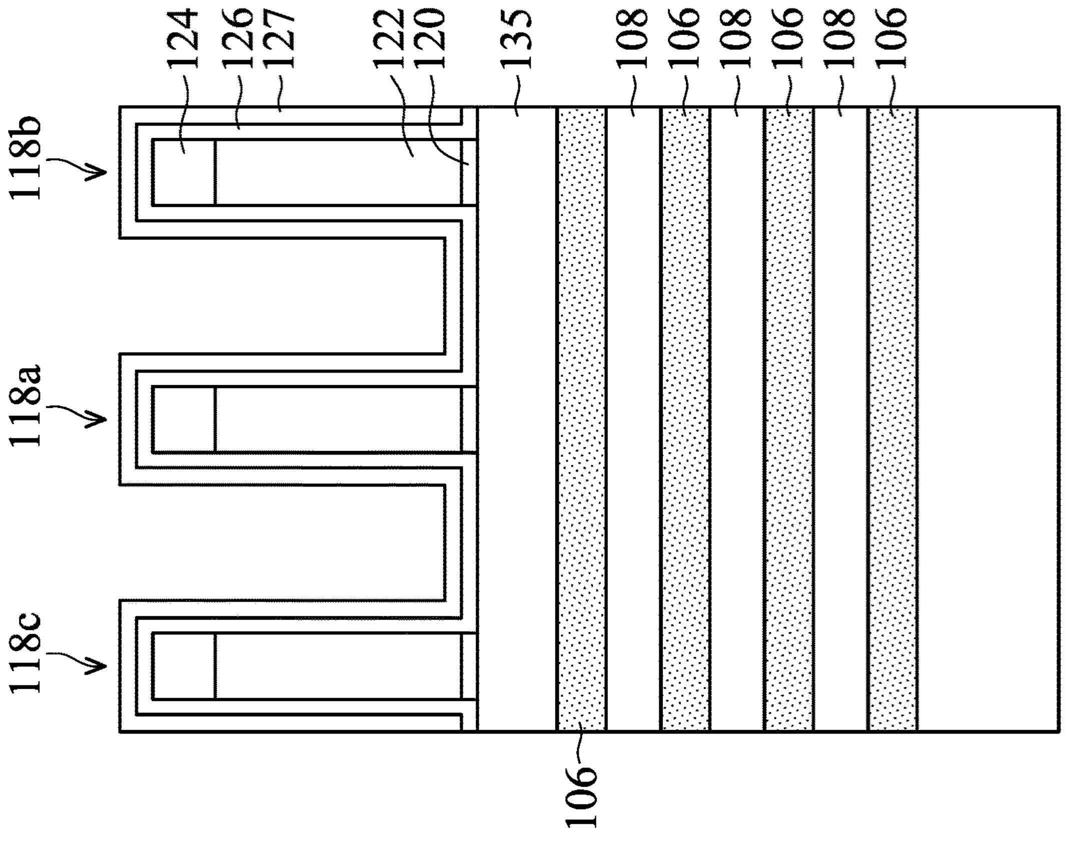

As shown in FIG. 6A, the hard mask layer 135 is formed on the stack of the first semiconductor layers 106 and the second semiconductor layers 108. The first dummy gate structure 118*a* is formed on the first fin structure 104*a*, and the first gate spacer layers 126 are formed on the opposite sidewall surfaces of the first gate spacer layers 126, and the second gate spacer layer 127 are formed on the first gate spacer layers 126. In addition, the hard mask layer 135 is below the first dummy gate structure 118*a*, the second dummy gate structure 118*b* and the third dummy gate structure 118*c*.

It should be noted that the top second semiconductor layers 108*a* and the bottom semiconductor layers 108*b* are not shown in FIG. 6A. The hard mask layer 135 is in direct contact with the topmost first semiconductor layers 106. In addition, the first dummy gate structure 118*a*, the first gate spacer layers 126 are in direct contact with the hard mask layer 135.

In some embodiments, the hard mask layer 135 is made of silicon nitride, silicon oxynitride, or another applicable material. In some embodiments, the hard mask layer 135 is formed by chemical vapor deposition (CVD), physical vapor deposition, (PVD), atomic layer deposition (ALD), or other applicable processes.

Afterwards, as shown in FIG. 6B, the source/drain (S/D) regions of the fin structure 104 are recessed to form source/drain (S/D) recesses 130, in accordance with some embodiments. Next, a portion of the first semiconductor material layers 106 exposed by the source/drain recesses 130 are laterally recessed to form notches 132. In addition, a portion of the hard mask layer 135 is removed to form the S/D recesses 130. As a result, the sidewall surface of the hard mask layer 135 is substantially aligned with the sidewall surface of the second semiconductor material layers 108.

Figure 6D:
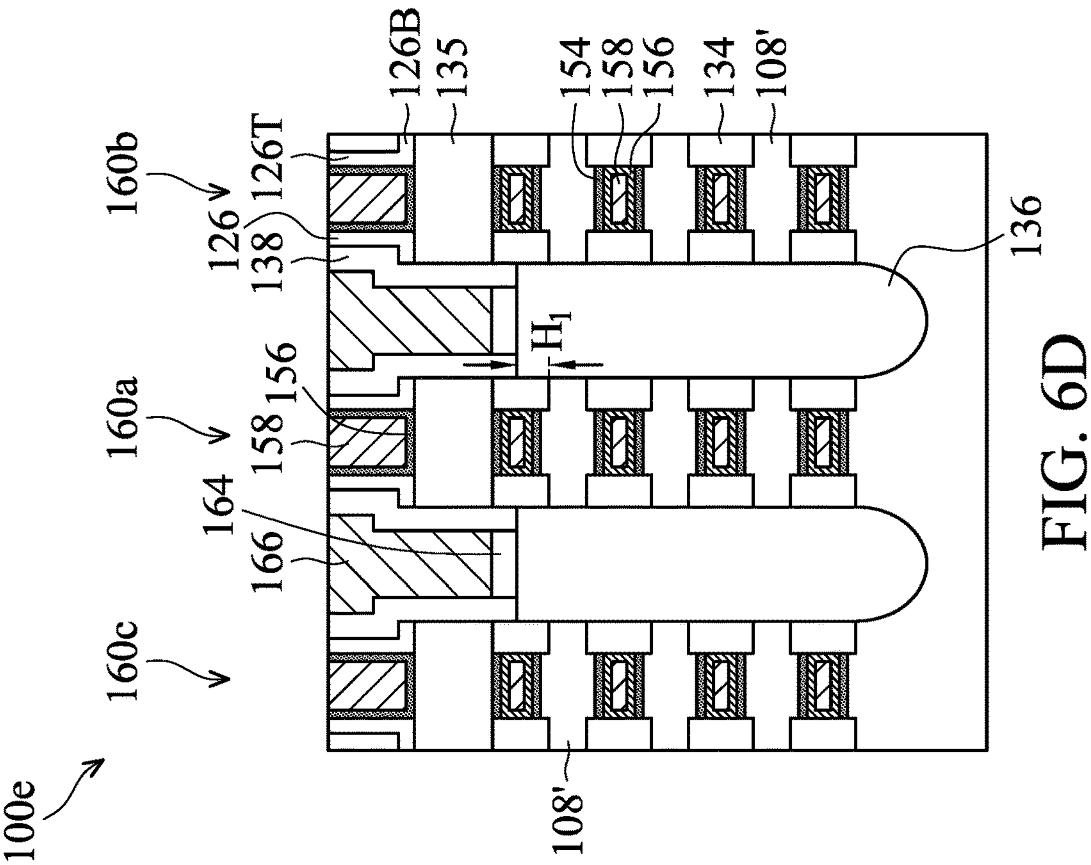
Figure 6C:
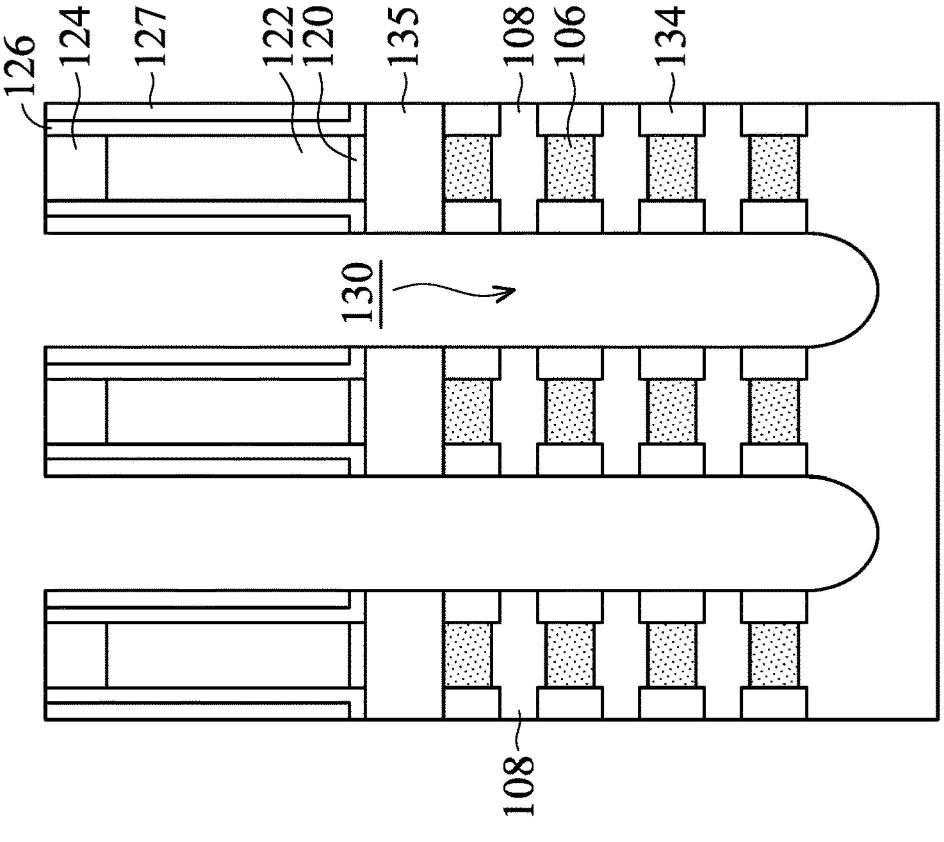

Next, as shown in FIG. 6C, the inner spacer layers 134 are formed in the notches 132, in accordance with some embodiments. The inner spacer layers 134 and the hard mask layer 135 are made of different materials. The outer sidewall surface of the hard mask layer 135 is substantially aligned with the outer sidewall surface of the inner spacer layer 134. The hard mask layer 135 is between the first dummy gate structure 118*a*, the second dummy gate structure 118*b* and the third dummy gate structure 118*c* and the inner spacer layers 134.

Afterwards, as shown in FIG. 6D, the second gate spacer layer 127 is removed, and the S/D structure 136 is formed in the S/D recess 130, in accordance with some embodiments. Next, the a number of the process are performed, similar to the processes for forming the semiconductor structure 100*a* shown in FIGS. 2G-2M.

It should be noted that the second gate spacer layer 127 is removed to enlarge the formation window, and the S/D structure 136 is easy to be formed in the S/D recess 130, even if the S/D recess 130 has a high aspect ratio.

Figure 7:
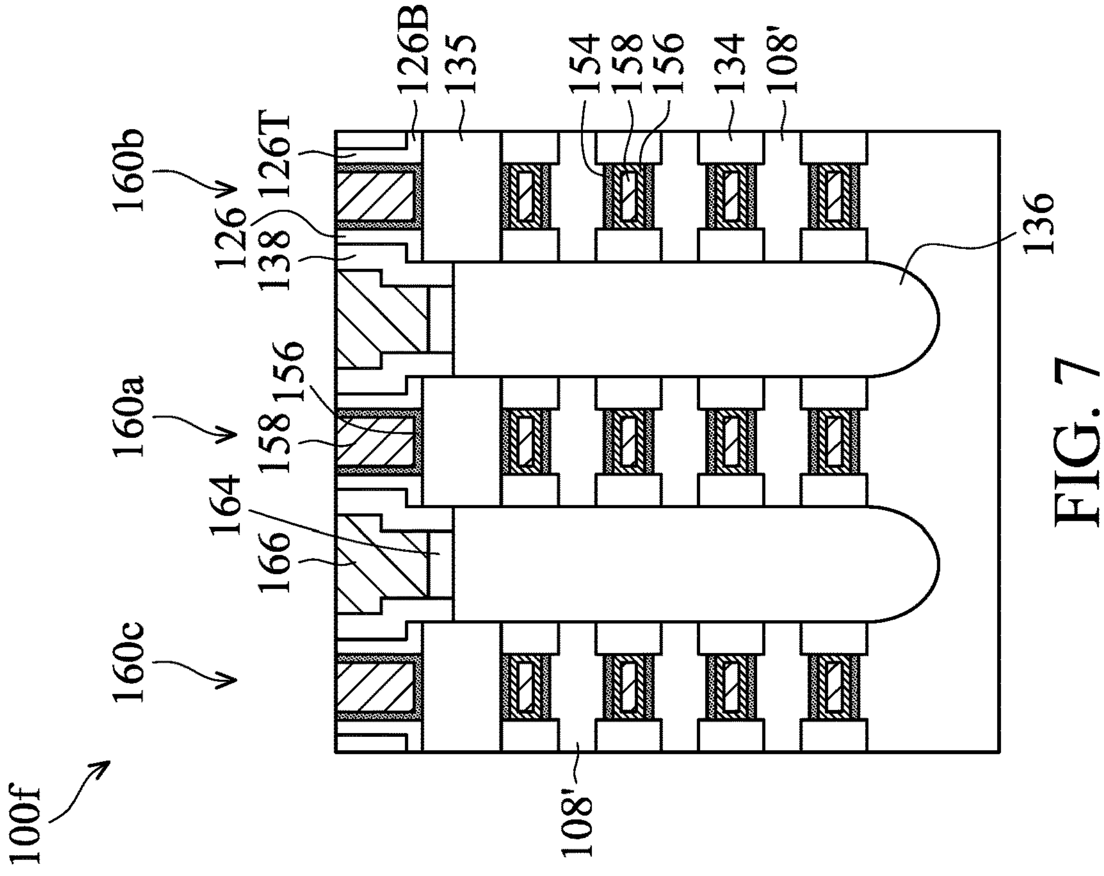
FIG. 7 illustrates a cross-sectional representation of a semiconductor structure, in accordance with some embodiments.

FIG. 7 illustrates a cross-sectional representation of a semiconductor structure 100*f*, in accordance with some embodiments. The semiconductor structure 100*f* of FIG. 7 includes elements that are similar to, or the same as, elements of the semiconductor structure 100*e* of FIG. 6D.

FIG. 7 is are similar to, or the same as, FIG. 6D, the difference between FIG. 7 and FIG. 6D is that the top surface of the S/D structure 136 is higher than the topmost surface of the inner spacer layer 134. The top surface of the S/D structure 136 is lower than the top surface of the hard mask layer 135, but higher than the topmost surface of the inner spacer layer 134.

FIGS. 8A to 8D illustrate cross-sectional representations of various stages of manufacturing a semiconductor structure 100*g*, in accordance with some embodiments. The semiconductor structure 100*g* of FIGS. 8A-8D includes elements that are similar to, or the same as, elements of the semiconductor structure 100*e* of FIGS. 6A-6D.

Figure 8A:
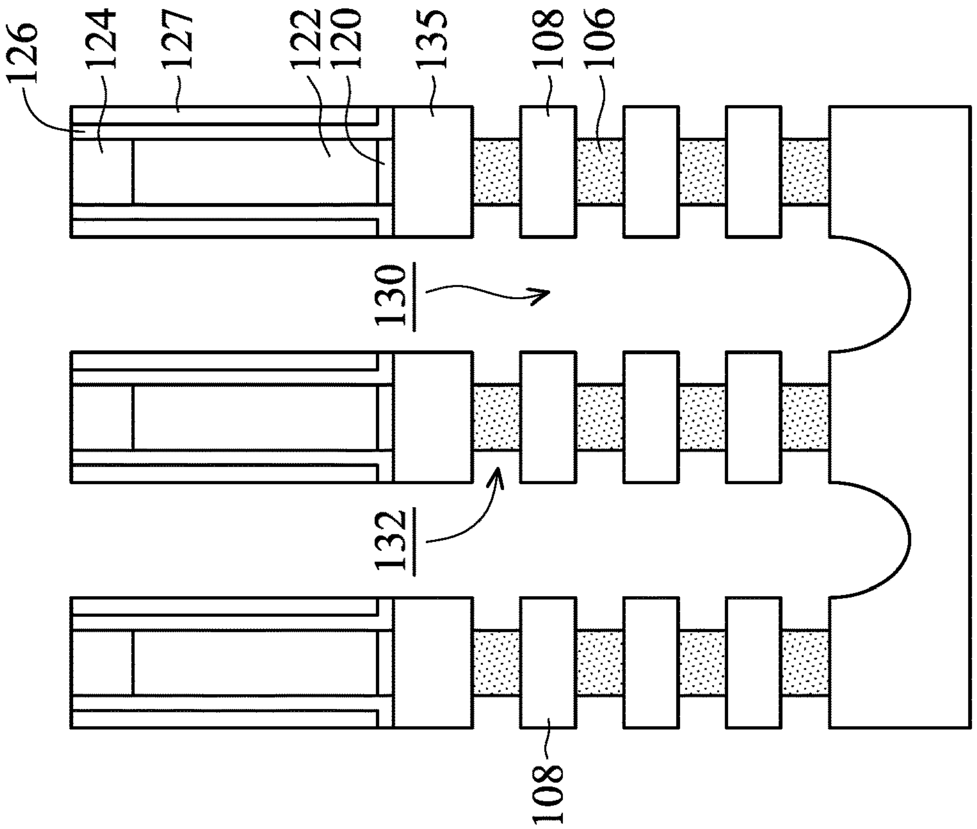
FIGS. 8A to 8D illustrate cross-sectional representations of various stages of manufacturing a semiconductor structure, in accordance with some embodiments.

As shown in FIG. 8A, the hard mask layer 135 is formed over the stack of the first semiconductor material layers 106 and the second semiconductor material layers 108, in accordance with some embodiments. After the source/drain (S/D) recesses 130 are formed, a portion of the first semiconductor material layers 106 exposed by the source/drain recesses 130 are laterally recessed to form the notches 132.

It should be noted that the second semiconductor material layer 108 is not removed while the portion of the first semiconductor material layers 106 is removed. Therefore, each of the second semiconductor material layers 108 still has rectangular shape when seen from a cross-sectional view.

Figure 8C:
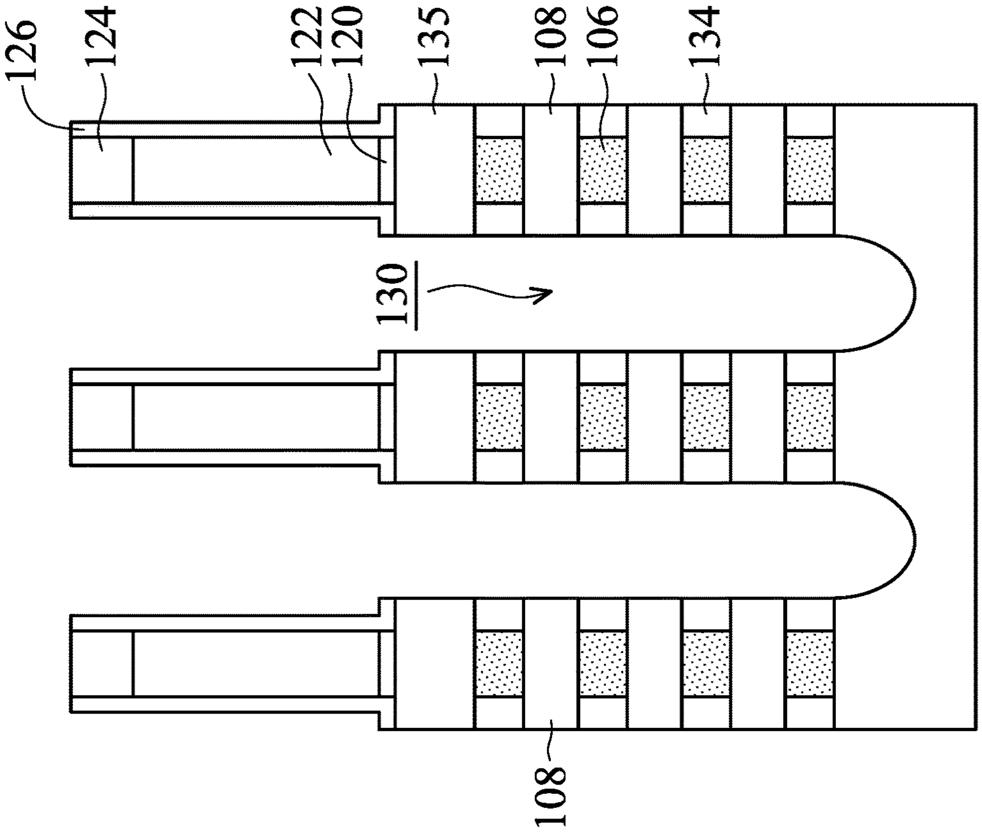
Figure 8B:
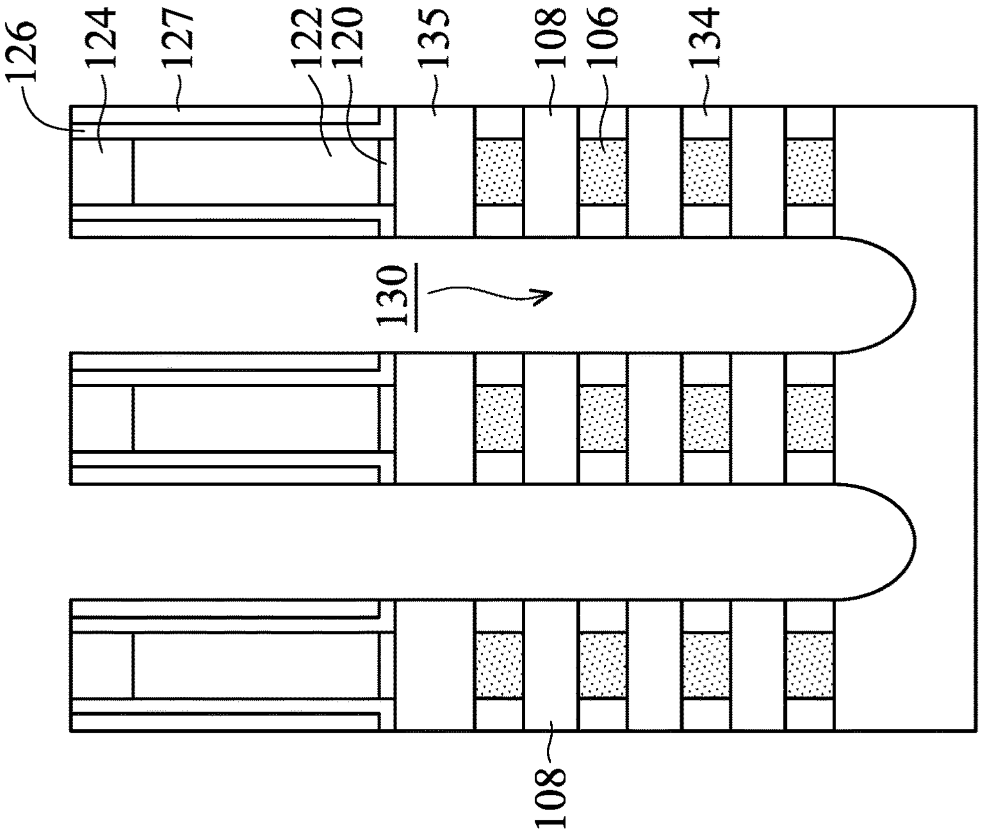

Afterwards, as shown in FIG. 8B, the inner spacer layers 134 are formed in the notches 132, in accordance with some embodiments. The inner spacer layers 134 and the hard mask layer 135 are made of different materials.

Next, as shown in FIG. 8C, the second gate spacer layer 127 is removed to expose the first gate spacer layer 126, in accordance with some embodiments.

Figure 8D:
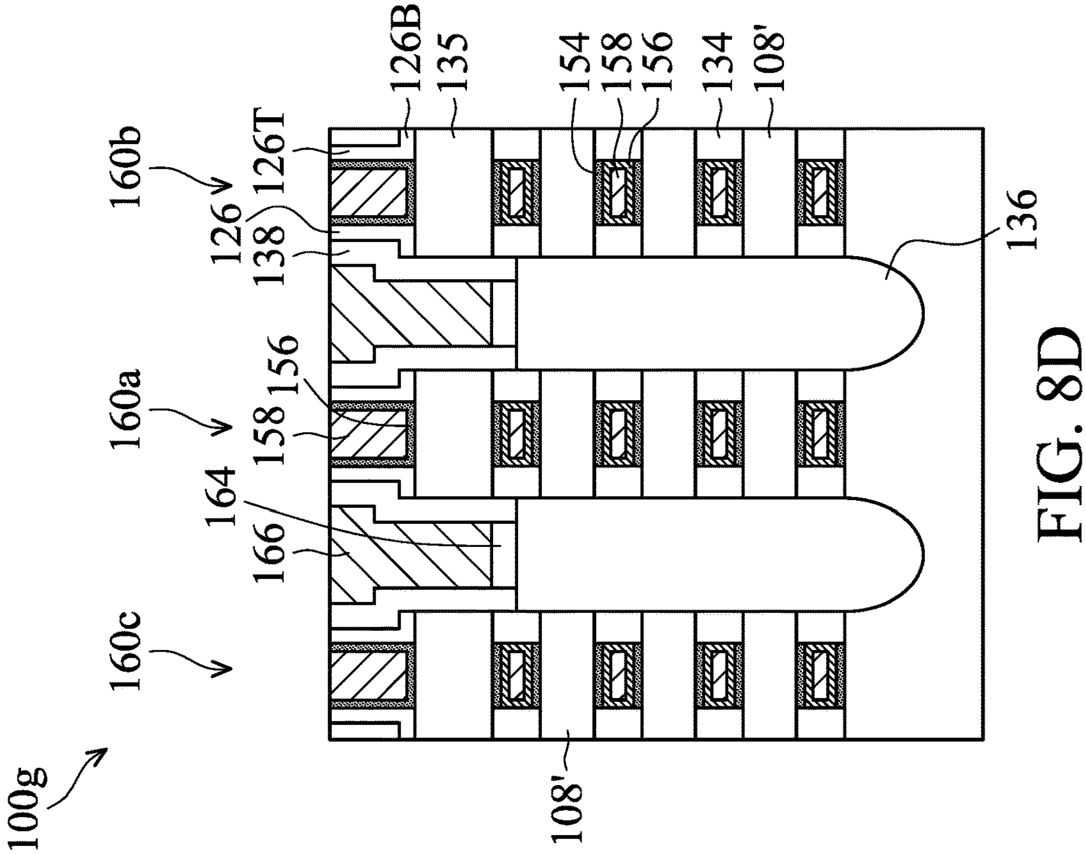

Afterwards, as shown in FIG. 8D, the S/D structure 136 is formed in the S/D recess 130, in accordance with some embodiments. Next, the a number of the process are performed, similar to the processes for forming the semiconductor structure 100*a* shown in FIGS. 2G-2M.

It should be noted that the second gate spacer layer 127 is removed to enlarge the formation window, and the S/D structure 136 is easy to be formed in the S/D recess 130, even if the S/D recess 130 has a high aspect ratio.

Figure 9:
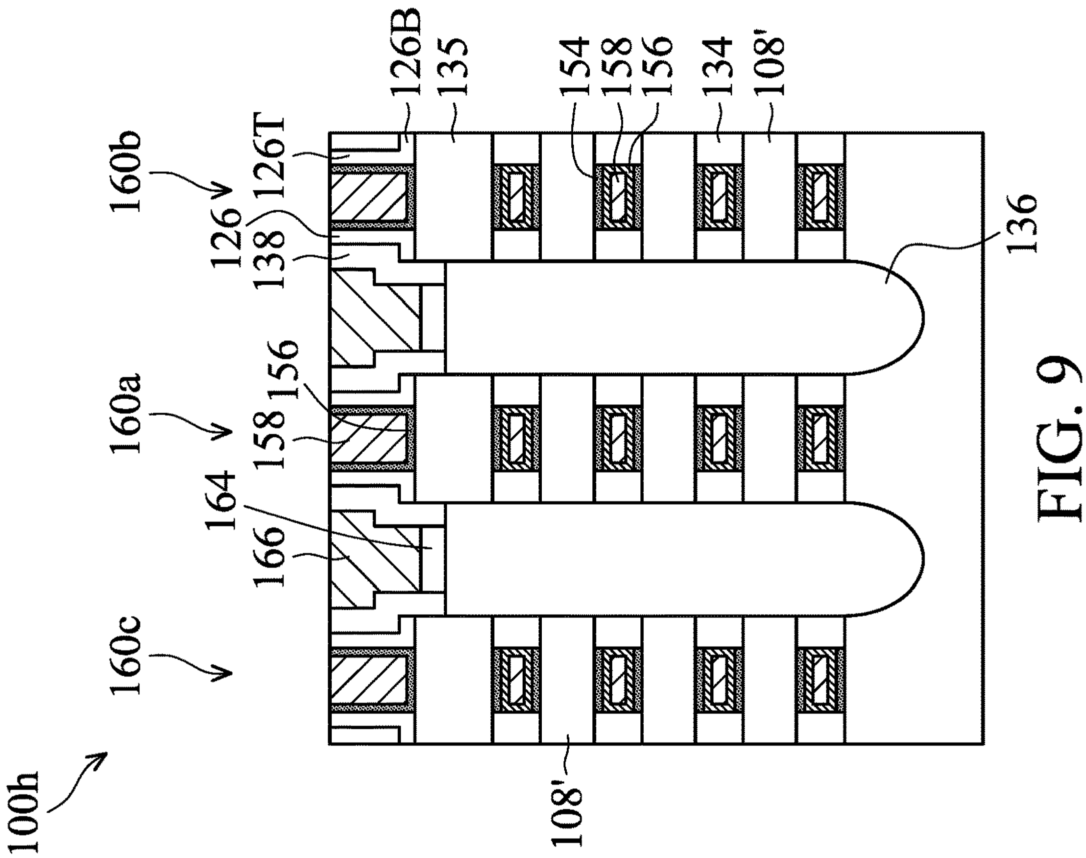
FIG. 9 illustrates a cross-sectional representation of a semiconductor structure, in accordance with some embodiments.

FIG. 9 illustrates a cross-sectional representation of a semiconductor structure 100*h*, in accordance with some embodiments. The semiconductor structure 100*h* of FIG. 9 includes elements that are similar to, or the same as, elements of the semiconductor structure 100*g* of FIG. 8D.

FIG. 9 is are similar to, or the same as, FIG. 8D, the difference between FIG. 9 and FIG. 8D is that the top surface of the S/D structure 136 is higher than the topmost surface of the inner spacer layer 134. The top surface of the S/D structure 136 is lower than the top surface of the hard mask layer 135, but higher than the topmost surface of the inner spacer layer 134.

Since the second gate spacer layer 127 is removed to enlarge the formation widow for forming the S/D structures 136 (in FIG. 2G). Therefore, the formation process and the quality of the S/D structures 136 are improved. Therefore, the semiconductor structures 100*a*-100*h* are improved.

It should be noted that the same elements in FIGS. 1A to 9 may be designated by the same numerals and may include similar or the same materials and may be formed by similar or the same processes; therefore such redundant details are omitted in the interest of brevity. In addition, although FIGS. 1A to 9 are described in relation to the method, it will be appreciated that the structures disclosed in FIGS. 1A to 9 are not limited to the method but may stand alone as structures independent of the method. Similarly, although the methods shown in FIGS. 1A to 9 are not limited to the disclosed structures but may stand alone independent of the structures. Furthermore, the nanostructures described above may include nanowires, nanosheets, or other applicable nanostructures in accordance with some embodiments.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure includes nanostructures and the gate structure formed over the nanostructures. The first gate spacer layer and the second gate spacer layer are formed on opposite sidewall surfaces of the gate structure. The S/D structures are formed adjacent to the gate structure. The second gate spacer layer is removed to provide a large widow for forming the S/D structures before forming the S/D structures. In addition, the unwanted residue during forming the S/D structures can easily be removed by forming the large widow. As a result, the formation process and the quality of the S/D structures are improved.

In some embodiments, a semiconductor structure is provided. The semiconductor structure includes nanostructures formed over a substrate along a first direction, and a gate structure formed over the nanostructures along a second direction.

The semiconductor structure includes an S/D structure formed adjacent to the gate structure, and a plurality of inner spacer layers between the gate structure and the S/D structure. The semiconductor structure includes a hard mask layer formed on the inner spacer layers, and a top surface of the hard mask layer is higher than a top surface of the S/D structure.

In some embodiments, a semiconductor provided. The semiconductor structure includes first nanostructures formed over a substrate along a first direction, and a first gate structure formed over the first nanostructures along a second direction. The semiconductor structure includes a first gate spacer layer formed adjacent to the first gate structure, and the first gate spacer layer has a top portion and a bottom portion, and a sidewall surface of the bottom portion extends beyond a sidewall surface of the top portion. The semiconductor structure also includes a first S/D structure formed adjacent to the first gate structure. The semiconductor structure includes an inner spacer layer adjacent to the first S/D structure, and an outer sidewall surface of the inner spacer layer extends beyond the sidewall surface of the top portion of the first gate spacer layer.

In some embodiments, a method for forming a semiconductor structure is provided. The method includes forming a fin structure over a substrate, and the fin structure comprises first semiconductor material layers and second semiconductor material layers alternately stacked. The method includes forming a dummy gate structure over the fin structure, and forming a first gate spacer layer and a second gate spacer layer on a sidewall surface of the dummy gate structure. The method also includes removing a portion of the second semiconductor layers to form notches, and forming inner spacer layers in the notches. The method includes removing the second spacer layer. The method includes forming an S/D structure in an S/D region after removing the second spacer layer, and a top surface of the S/D structure is lower than a bottom surface of the first gate spacer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising: forming a fin structure over a substrate, wherein the fin structure comprises first semiconductor material layers and second semiconductor material layers alternately stacked; forming a dummy gate structure over the fin structure; forming a first gate spacer layer and a second gate spacer layer on a sidewall surface of the dummy gate structure; removing a portion of the second semiconductor material layers to form notches; forming inner spacer layers in the notches; removing the second gate spacer layer; and forming an S/D structure in an S/D region after removing the second gate spacer layer, wherein a top surface of the S/D structure is lower than a bottom surface of the first gate spacer layer.

2. The method for forming the semiconductor structure as claimed in claim 1, further comprising: forming a semiconductor layer over the fin structure; removing the semiconductor layer to form a trench when removing the portion of the second semiconductor material layers to form notches; forming an inner spacer material in the trench; and removing a portion of the inner spacer material outside the trench to form a hard mask layer over the inner spacer layers.

3. The method for forming the semiconductor structure as claimed in claim 1, further comprising: forming a hard mask layer over the fin structure, wherein the hard mask layer is between the dummy gate structure and the inner spacer layers.

4. The method for forming the semiconductor structure as claimed in claim 3, further comprising: forming a contact etch stop layer over the S/D structure, wherein a portion of the contact etch stop layer is lower than a bottom surface of the hard mask layer.

5. The method for forming the semiconductor structure as claimed in claim 4, further comprising: forming an S/D contact structure over the S/D structure, wherein the S/D contact structure has a T-shaped structure.

6. The method for forming the semiconductor structure as claimed in claim 1, further comprising: forming a third semiconductor layer over the fin structure; removing the third semiconductor layer to form a trench; and forming a hard mask layer in the trench.

7. The method for forming the semiconductor structure as claimed in claim 6, wherein the first gate spacer layer has a horizontal portion and a vertical portion, and a sidewall surface of the horizontal portion is aligned with a sidewall surface of the hard mask layer.

8. The method for forming the semiconductor structure as claimed in claim 7, wherein a sidewall surface of one of the inner spacer layers extends beyond a sidewall surface of the vertical portion of the first gate spacer layer.

9. The method for forming the semiconductor structure as claimed in claim 1, further comprising: removing the first semiconductor material layers to form a plurality of nanostructures; and forming a gate structure on the nanostructures.

10. A method for forming a semiconductor structure, comprising: forming a stack structure over a substrate, wherein the stack structure comprises first semiconductor material layers and second semiconductor material layers alternately stacked; forming a third semiconductor material layer over the stack structure; forming a dummy gate structure over the stack structure; forming a first gate spacer layer and a second gate spacer layer on a sidewall surface of the dummy gate structure; removing a portion of the stack structure to form a recess; removing a portion of the second semiconductor material layers to form notches; removing the third semiconductor material layer to form a trench; forming inner spacer layers in the notches; forming a hard mask layer in the trench, wherein the hard mask layer is over the inner spacer layers; removing the second gate spacer layer to expose the first gate spacer layer; and forming an S/D structure in the recess.

11. The method for forming the semiconductor structure as claimed in claim 10, further comprising: forming a contact etch stop layer over the S/D structure, wherein a portion of the contact etch stop layer is lower than a top surface of the hard mask layer.

12. The method for forming the semiconductor structure as claimed in claim 11, further comprising: forming a silicide layer over the S/D structure, wherein the silicide layer interfaces with the contact etch stop layer; and forming an S/D contact structure over the silicide layer, wherein the S/D contact structure has a T-shaped structure.

13. The method for forming the semiconductor structure as claimed in claim 10, wherein the hard mask layer is separated from the inner spacer layers.

14. The method for forming the semiconductor structure as claimed in claim 10, wherein a top surface of the S/D structure is lower than a topmost surface of the inner spacer layers.

15. A method for forming a semiconductor structure, comprising: forming a stack structure over a substrate, wherein the stack structure comprises first semiconductor material layers and second semiconductor material layers alternately stacked; forming a third semiconductor material layer over the stack structure; forming a dummy gate structure over the stack structure; forming a first gate spacer layer and a second gate spacer layer on a sidewall surface of the dummy gate structure, wherein the first gate spacer layer has a horizontal portion, and the second gate spacer layer is formed on the horizontal portion; removing a portion of the stack structure to form a recess; removing the third semiconductor material layer to form a trench; forming a hard mask layer in the trench, wherein the hard mask layer is higher than the stack structure; removing the second gate spacer layer to expose the first gate spacer layer; and forming an S/D structure in the recess, wherein a top surface of the S/D structure is lower than a bottom surface of the first gate spacer layer.

16. The method for forming the semiconductor structure as claimed in claim 15, further comprising: removing a portion of the second semiconductor material layers to form notches; and forming inner spacer layers in the notches, wherein a topmost surface of the inner spacer layers is higher than a top surface of the S/D structure.

17. The method for forming the semiconductor structure as claimed in claim 15, further comprising: forming an S/D contact structure over the S/D structure, wherein the S/D contact structure has a bottom portion lower than a top surface of the hard mask layer.

18. The method for forming the semiconductor structure as claimed in claim 15, further comprising: forming a contact etch stop layer over the S/D structure, wherein the contact etch stop layer has a step-shaped structure.

19. The method for forming the semiconductor structure as claimed in claim 15, further comprising: forming a fourth semiconductor material layer on the third semiconductor material layer; and simultaneously removing the fourth semiconductor material layer when removing the third semiconductor material layer.

20. The method for forming the semiconductor structure as claimed in claim 15, wherein the top surface of the S/D structure is lower than a top surface of the hard mask layer.

* * * * *